United States Patent [19]
Felts et al.

[11] Patent Number: 4,888,199
[45] Date of Patent: Dec. 19, 1989

[54] PLASMA THIN FILM DEPOSITION PROCESS

[75] Inventors: John T. Felts, Alameda; Eugene S. Lopata, Fremont, both of Calif.

[73] Assignee: The BOC Group, Inc., Murray Hill, N.J.

[21] Appl. No.: 191,448

[22] Filed: May 9, 1988

Related U.S. Application Data

[63] Continuation-in-part of Ser. No. 73,928, Jul. 15, 1987, abandoned.

[51] Int. Cl.$^4$ .............................................. B05D 3/06
[52] U.S. Cl. ........................................ 427/10; 427/38
[58] Field of Search ..................................... 427/10, 38

[56] References Cited

U.S. PATENT DOCUMENTS 4,006,404 6/1976 Szuszczewicz .
4,362,936 2/1982 Hofmann et al. .

OTHER PUBLICATIONS

Greene, *J. Vac. Sci. Technol.*, 15(5), Sep./Oct. 1978, pp. 1718–1729.
Yasuda et al., *Journal of Polymer Science: Chemistry Edition*, vol. 16, pp. 743–759 (1978).
Inspektor et al., *Plasma Chemistry and Plasma Processing*, vol. 1, No. 4, 1981, pp. 377–395.
Wertheimer et al., *Thin Solid Films*, 115 (1984), pp. 109–124.
Suzuki et al., *Japanese Journal of Applied Physics*, vol. 25, No. 10, Oct. 1986, pp. 1589–1593.

*Primary Examiner*—Bernard Pianalto
*Attorney, Agent, or Firm*—David A. Draegert; Larry R. Cassett

[57] ABSTRACT

In a process of depositing a thin film onto a surface of a substrate with the use of a plasma, wherein the plasma optical emission is monitored, analyzed, and the results used to automatically control the nature of the plasma in order to control the characteristics of the deposited thin film. One aspect of the emission that is detected is the intensity of each of two emission lines of different wavelength bands from the same plasma species, the intensities being ratioed and the ratio compared to a predetermined value known to provide a resulting film with uniform and repeatable characteristics. This ratio is also related to the average electron temperature of the plasma, which can be calculated from it. Additionally, the intensity of another emission line from another of the plasma species may be measured and ratioed to one of the foregoing line intensities if additional control is desired.

20 Claims, 9 Drawing Sheets

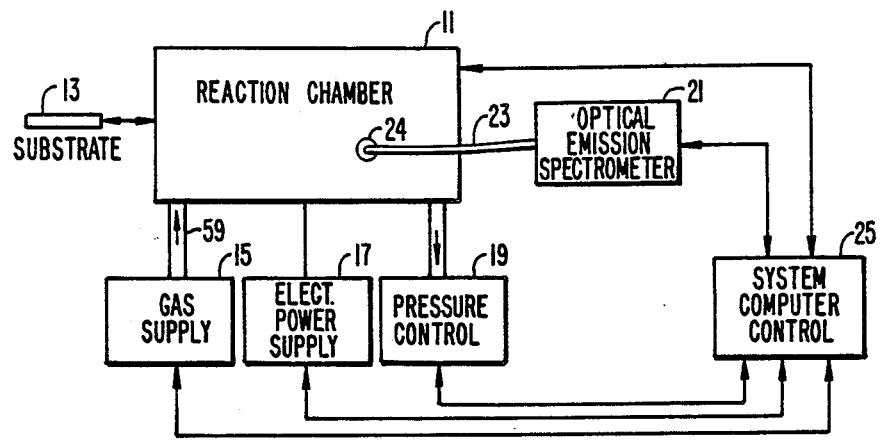
FIG._1.
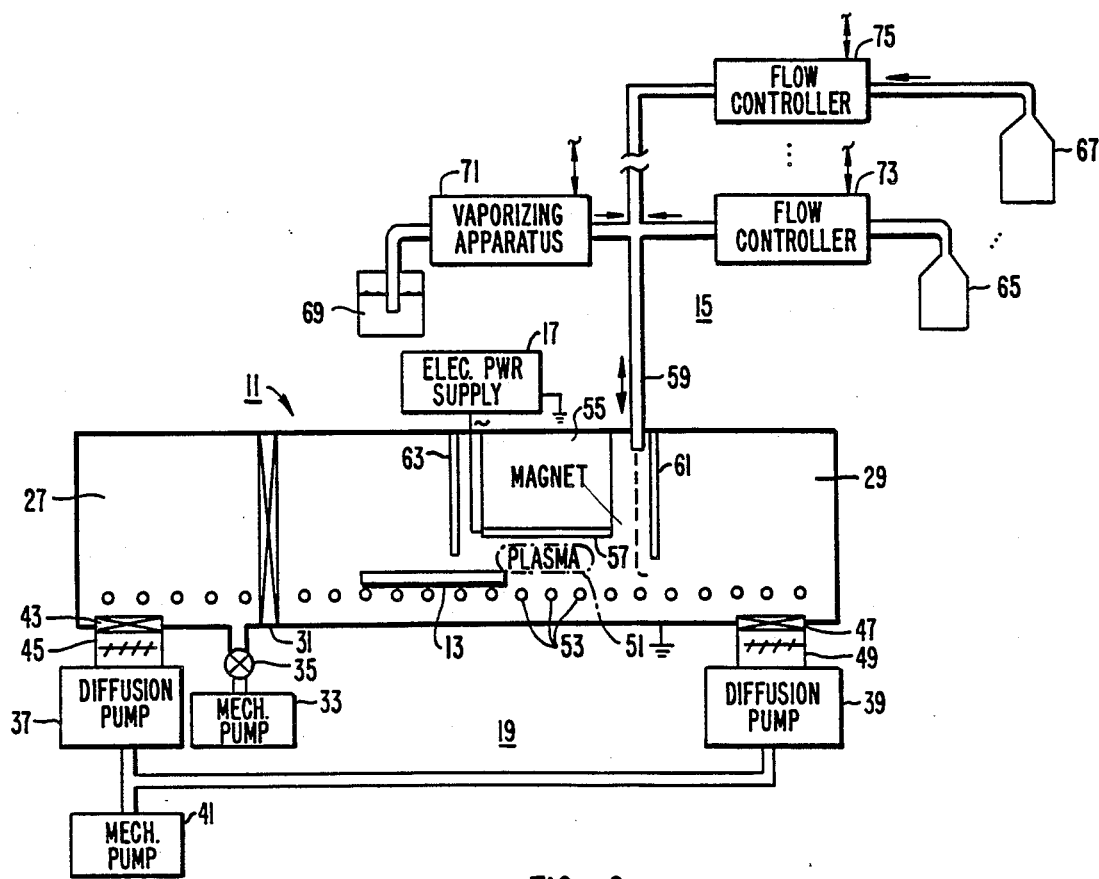
FIG._2.

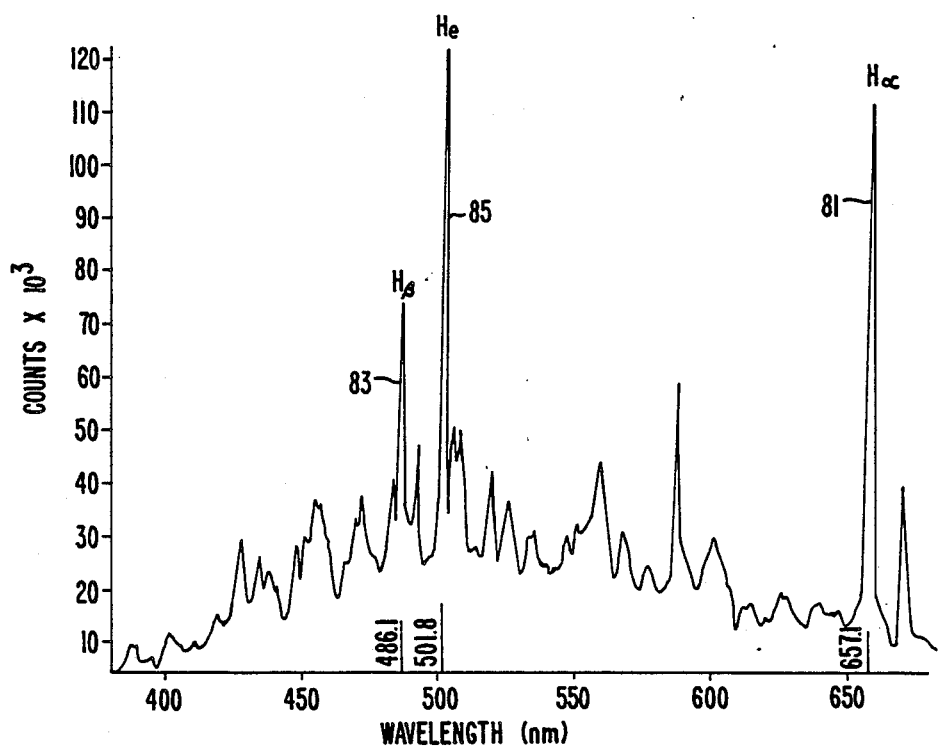
FIG._3.

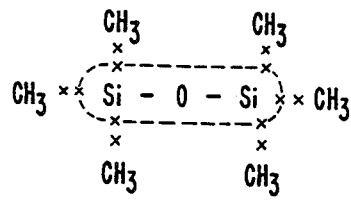
BOND STRENGTH:
— 8.31 eV
×× 4.53 eV
FIG._4A.
BOND STRENGTH:
·· 3.51 eV
FIG._4B.
BOND STRENGTH:
·· 6.31 eV
FIG._4C.
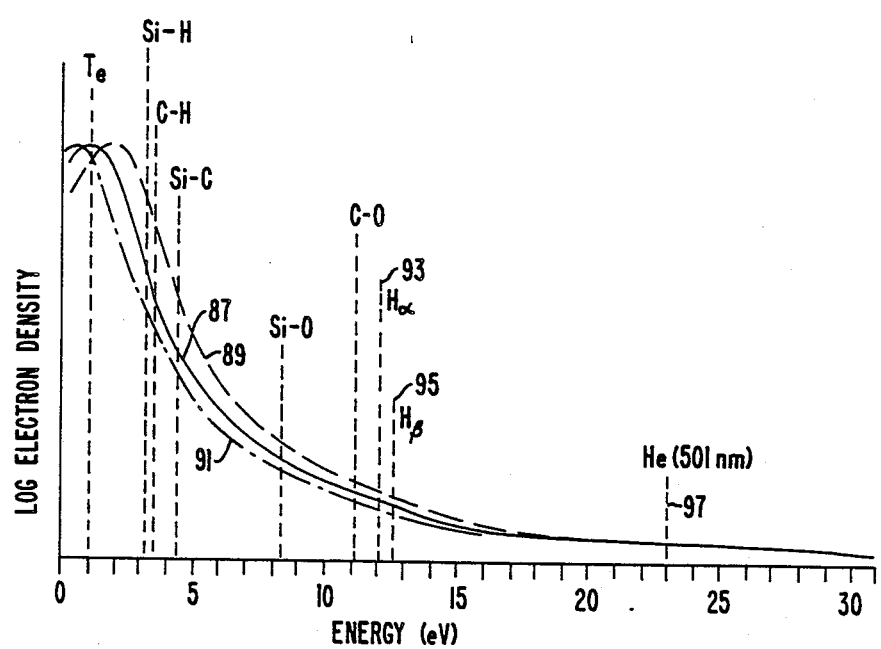
FIG._5.
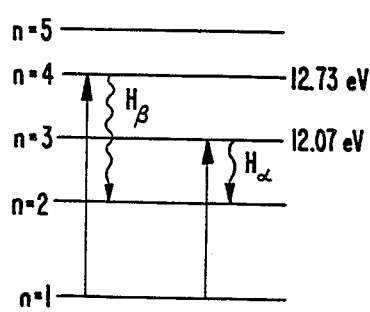
FIG._6.

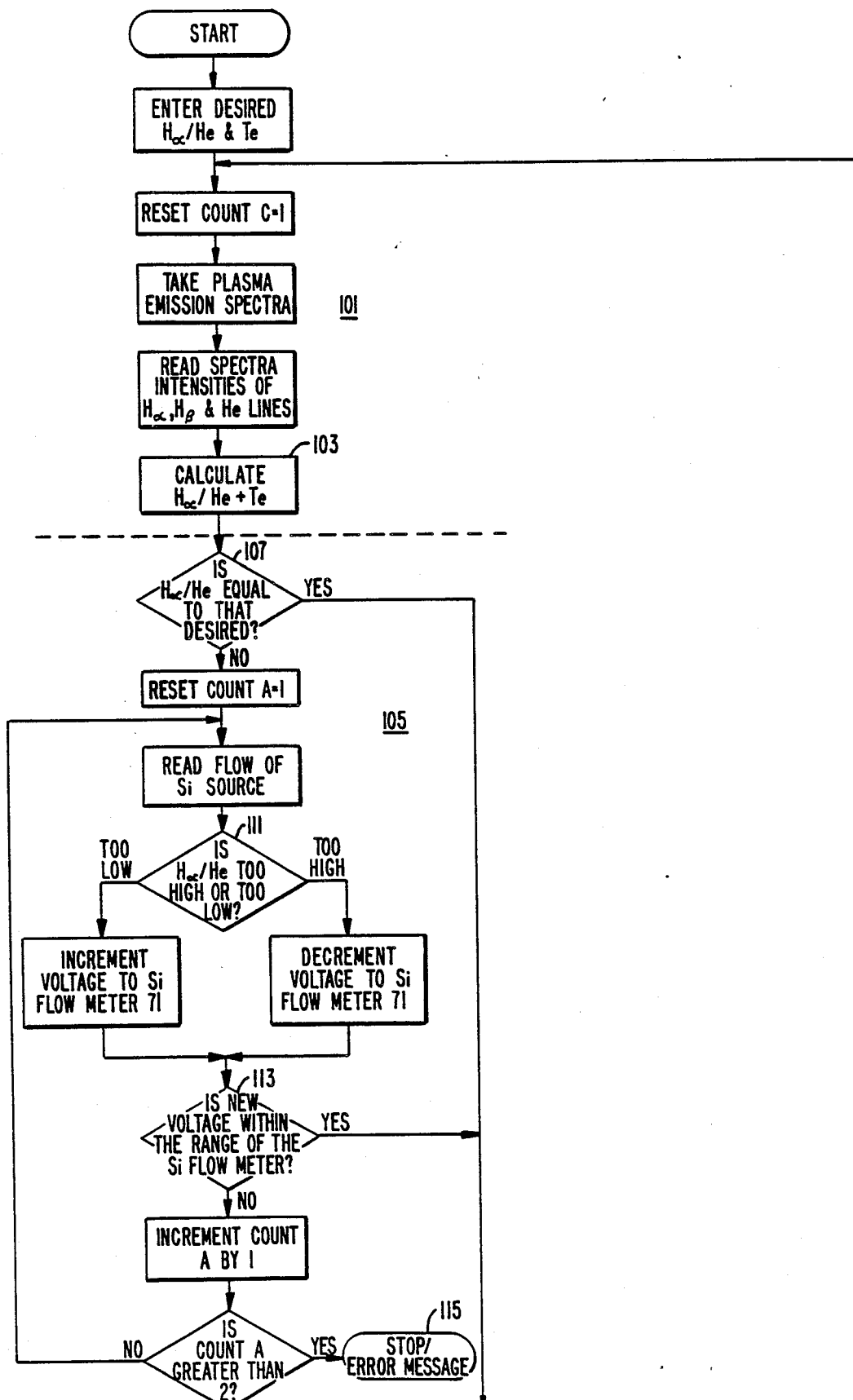
FIG._7.
(PART 1 OF 3)

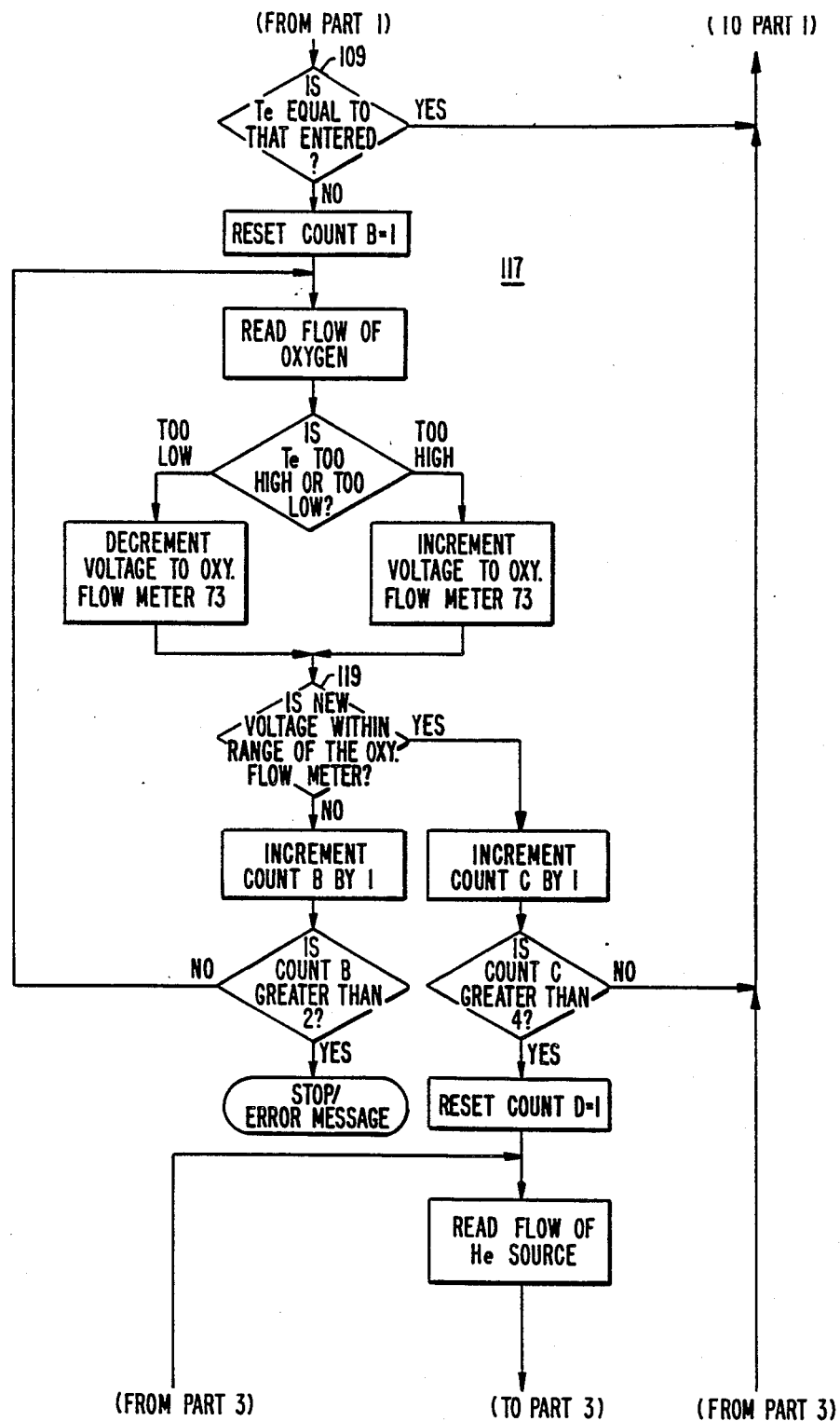
FIG._7.
(PART 2 OF 3)

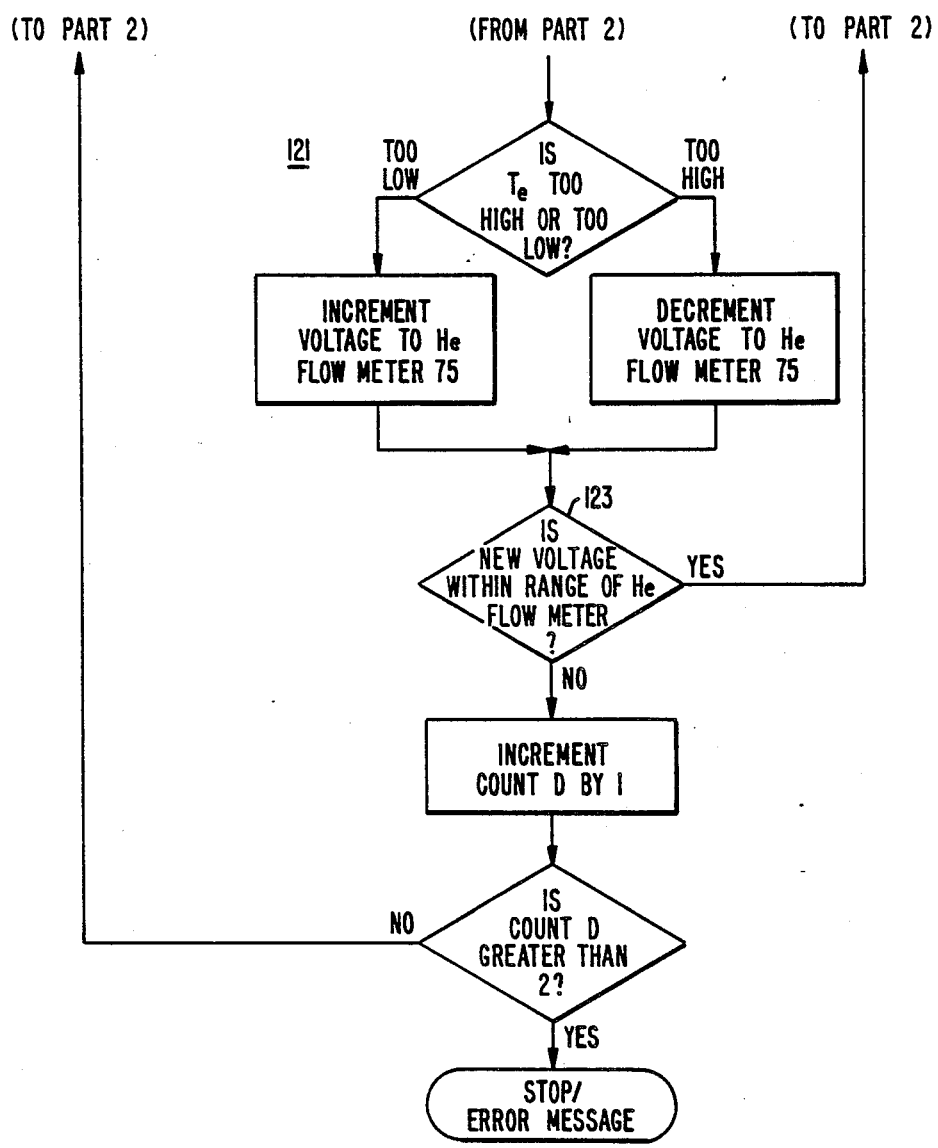
FIG._7.
(PART 3 OF 3)

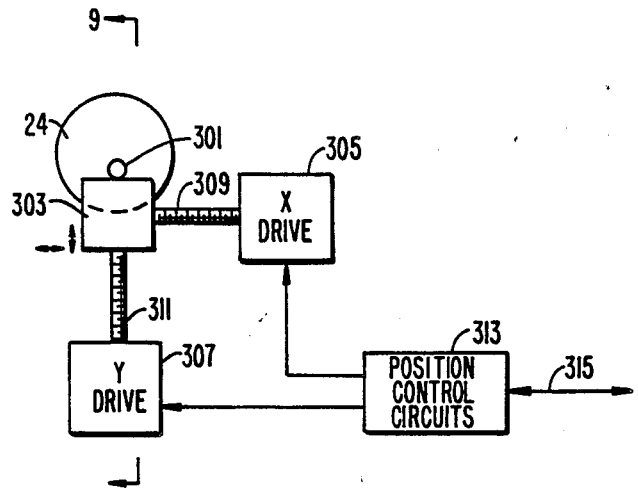
FIG._8.
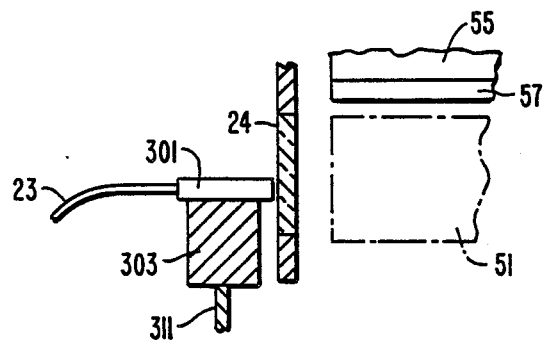
FIG._9.
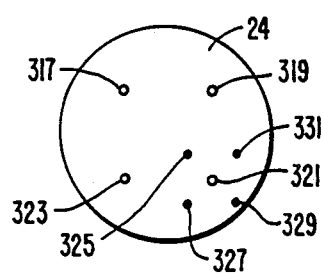
FIG._10.

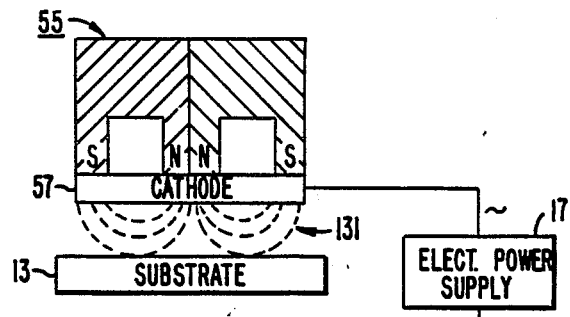
FIG._11A.
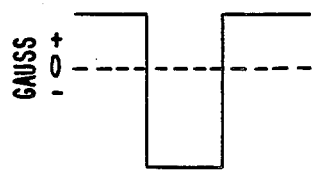
FIG._11B.
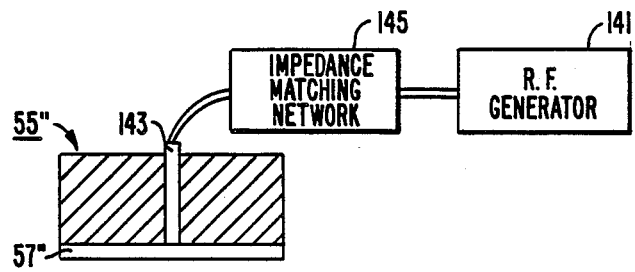
FIG._13.
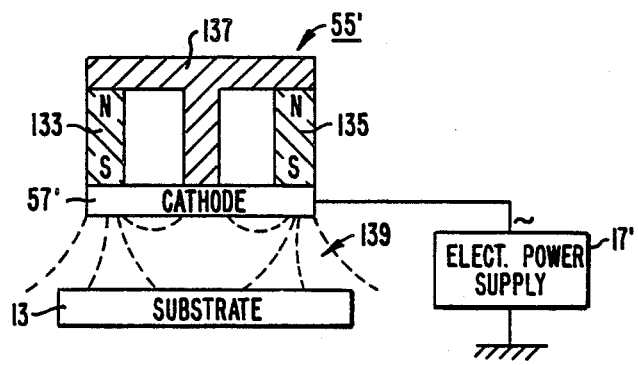
FIG._12A.
FIG._12B.

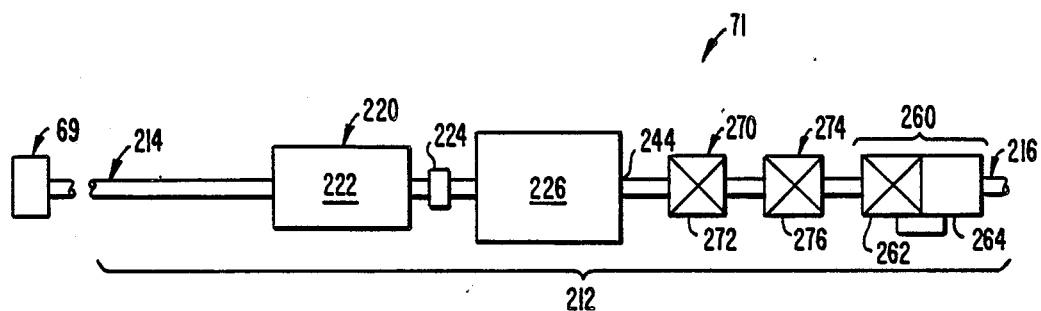
FIG._14.
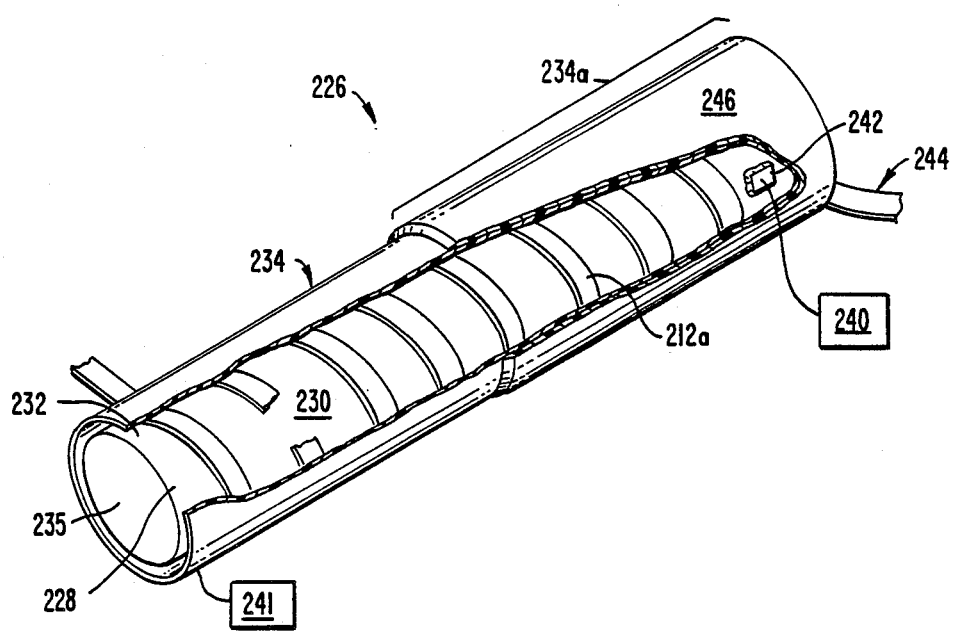
FIG._15.

PLASMA THIN FILM DEPOSITION PROCESS

CROSS-REFERENCE TO RELATED APPLICATION

This is a continuation-in-part of co-pending application Ser. No. 07/073,928, filed July 15, 1987 now abandoned.

BACKGROUND OF THE INVENTION

This invention relates generally to plasma diagnostics and process control in depositing thin films on substrates, particularly those processes utilizing sputtering, plasma enhanced chemical vapor deposition (PECVD) and plasma polymerization.

As is well known, a thin film depositing plasma is formed in a chamber by introducing at least one gas into a region of a controlled electrical field. Many such plasma processes operate at low pressure with magnetic confinement. Most plasma processes involve a control of at least the internal pressure level, the electrical field characteristics, and the composition and proportional flow rates of individual gases into the plasma. Selection of these variables, in turn, affects the properties of a resulting thin film. Such properties can include the film's hardness, its adhesion to the substrate, its permeability to certain liquids or gases, optical characteristics of translucence and refractive index, and its general composition. The property or properties of the resulting film that are important depend upon the purpose and application of the resulting product. For example, if a scratch resistant coating is being applied to glass, the film's hardness, adhesion to glass and degree of optical clarity are the most important properties. In another example, wherein a coating is desired to prevent the permeation of oxygen, that property of the thin film is most important.

It is, of course, desired to control the plasma variables in order to produce a product with the desired film properties. Heretofore, most process control has been manual, based upon some but incomplete measurement of the resulting plasma characteristics. One such technique is to measure the electron temperature ($T_e$) of the plasma, which is a measure of the average electron energy in the plasma, by the use of available Langmuir (electrostatic) probe(s) positioned in the plasma. The plasma variables are then manually adjusted until the average electron temperature corresponds to that which has been determined to be necessary for obtaining the desired film properties or rate of deposition of the film on the substrate. However, since the Langmuir probe(s) must be positioned in the plasma, they quickly become coated with the film being deposited and its readings then are subject to considerable error. Also, such an average electron temperature measurement provides only a partial picture of the plasma's characteristics which, in some thin film processes, is inadequate.

It is still the practice in large-scale commercial thin film deposition processes to adjust the plasma variables to a combination that is believed by the operator to be optimum for a particular application, and then to run and test a sample. Only when the plasma variables have been readjusted in response to many such test cycles is the plasma process adjusted for commercial runs.

Therefore, it is a primary object of the present invention to provide improved monitoring and control of the plasma process in order to provide a higher yield of coated product having films with uniform and repeatable properties.

It is another object of the present invention to provide a plasma thin film deposition process that is suitable for continuous commercial use in the coating of large substrates such as automobile and architectural glass.

SUMMARY OF THE INVENTION

These and additional objects are accomplished by the various aspects of the present invention wherein, briefly and generally, characteristics of the emission of electromagnetic radiation in the visible and near visible regions of the plasma are monitored, such as by use of a spectrometer, and input variables to the plasma process are controlled in response to this monitoring. The purpose of this monitoring and control is to maintain the monitored aspects of the plasma emission at a level that has been determined to relate to certain desired properties of the thin film that is being deposited. Such properties may be resistance to scratching or optical clarity of the film, as examples. Certain aspects of the plasma emission found to correlate with a high film deposition rate can also be controlled. These plasma characteristics are controlled in real time by automatically making any adjustments to the plasma input variables that are necessary to maintain the monitored plasma emission characteristics within close limits. This results in the thin film coating being uniform and the process being repeatable. The necessity for independent test depositions and subsequent analysis of the film properties is minimized. A high yield process for commercially coating large substrates is made practical by this diagnostic and control technique.

According to a particular aspect of the present invention, described in detail hereinafter, the intensity of each of a plurality of lines of emission of the plasma is measured and compared. It has been found that the average electron temperature ($T_e$) in the plasma is proportional to a ratio of the intensities of two lines of emissions from a single species in the plasma. Since such a species has been excited to emission by absorbing energy from colliding electrons, the intensity of the lines is proportional to such an average energy. By comparing emission line intensities, the distribution of those energies can be estimated and $T_e$ calculated. The average electron temperature of the plasma affects the film deposition rate and properties of the resulting film, so it is an important piece of information to have in a real time plasma control system. As an alternative to calculating the average electron temperature, the ratio of intensities of the emission lines in the single species may be controlled directly by adjusting the plasma input variables until a predetermined value of the ratio is obtained, the predetermined value having been earlier determined to provide a film having the desired properties.

By taking another ratio of two emission lines, one produced by a species that necessarily absorbs a high energy from electron collisions with it and another from a species having a probability of having absorbed much lower energy from electron collisions with it to give the measured emission, a declining "tail" of an electron energy (temperature) distribution within the plasma can be monitored and controlled. It has been found that high energy electrons in the plasma can inadvertently be suppressed in the course of optimizing other variables. Therefore, a separate high energy electron density measurement reveals whether this is happening or not and allows an adjustment to be made in real time to maintain a sufficient proportion of high energy electrons in the plasma. An adequate supply of high energy electrons is important to the hardness of the resulting film.

Additional objects, advantages and features of the various aspects of the present invention will become apparent from the following description of its preferred embodiments, such description being given in conjunction with the accompanying drawings.

BRIEF DESCRIPTION OF THE DRAWINGS

FIG. 1 is a general schematic diagram illustrating a plasma system utilizing the various aspects of the present invention;

FIG. 2 schematically illustrates a side sectional view of the plasma deposition chamber and its associated equipment;

FIG. 3 is an example spectrum of the emission of plasma;

FIGS. 4A, 4B and 4C illustrate the bonding of components of a molecule of a gas used in an example plasma enhanced chemical vapor deposition process;

FIG. 5 includes a series of curves that illustrate the electron energy distribution in an example plasma;

FIG. 6 is an example energy level diagram for a single species in a plasma;

FIG. 7 is a flow diagram for a computer program that controls plasma process input variables in response to the measured plasma spectra;

FIG. 8 shows additional elements added to the plasma system of FIGS. 1 and 2;

FIG. 9 is a partial sectional view of FIG. 8, taken at section 9—9 thereof;

FIG. 10 illustrates one aspect of the operation of the elements shown in FIGS. 8 and 9;

FIGS. 11A and 11B illustrate the use of a balanced magnetron in the system of FIG. 2;

FIGS. 12A and 12B illustrate the use of an unbalanced magnetron in the system of FIG. 2;

FIG. 13 illustrates an alternative structure for the system of FIG. 2 wherein an electric field is produced by a radio frequency generator;

FIG. 14 schematically illustrates a preferred form of the vaporizing apparatus of the system of FIG. 2; and FIG. 15 is a perspective view, partially broken away, of an element of the apparatus of FIG. 14.

DESCRIPTION OF THE PREFERRED EMBODIMENTS

GENERAL SYSTEM

Referring initially to FIG. 1, a system is schematically illustrated that includes an enclosed reaction chamber 11 in which a plasma is formed and in which a substrate, such as substrate 13, is placed for depositing a thin film of material on it. The substrate 13 can be any vacuum compatible material, such as metal, glass, some plastics and coated substrates. One or more gases are supplied to the reaction chamber by a gas supply system 15. An electric field is created by a power supply 17, and a low pressure is maintained by a pressure control system 19. An optical emission spectrometer 21 is connected through an optical fiber light transmission medium 23 to the reaction chamber in some appropriate manner to couple the visible and near visible emission (especially the ultraviolet wavelengths) of the plasma to the spectrometer. A quartz window 24 in a side wall of the reaction chamber can be used to optically couple the plasma emission with the external fiber medium 23. A general system control 25, including a computer control portion, is connected to each of the other components of the system in a manner to receive status information from them and send controlling commands to them.

The reaction chamber 11 can, in the system of FIG. 1, be of an appropriate type to perform any of the sputtering, plasma-enhanced chemical vapor deposition (PECVD), plasma polymerization processes or other vacuum thin film deposition processes. A more detailed explanation of certain components of the system of FIG. 1 is given with respect to FIG. 2, an example of the PECVD or plasma polymerization process being given. The reaction chamber 11 is divided into a load lock compartment 27 and a process compartment 29 by an isolation slit valve 31. The pressure control system 19 includes a mechanical pump 33 connected to the load lock chamber 27 by a valve 35. The pressure control system also includes diffusion pumps 37 and 39, and an associated mechanical pump 41. The diffusion pump 37 is connected to the load lock chamber 27 through an isolation gate valve 43 and an adjustable baffle 45. Similarly, the diffusion pump 39 is connected to the process chamber 29 through an isolation gate valve 47 and an adjustable baffle 49. The baffle 49 is controlled by the system control 25, while a coating process is being carried out, in order to maintain the internal pressure at a desired value.

A substrate to be coated is first loaded into the load lock compartment 27 with the valve 31 closed. The mechanical pump 33 then reduces the pressure most of the way to the high vacuum region. The diffusion pump 37 is then operated to reduce the pressure further, to about $5 \times 10^{-6}$ Torr. The operating pressure is typically in the neighborhood of 46 microns for a PECVD or plasma polymerization process and is achieved by flowing the process gases into the reaction chamber and throttling the diffusion pump 39 by use of the baffle 49. During loading and unloading operations, the diffusion pump 39 maintains the deposition chamber 29 at the operating pressure. Once the load lock chamber 27 is reduced to base pressure, the valve 31 is opened and the substrate 13 moved into the deposition chamber 29.

Provision is made for moving the substrate 13 back and forth through a region 51 where a plasma is formed. In the example system being described, this is accomplished by a plurality of rollers 53, preferably made of aluminium with substrate supporting, electrically insulative O-ring spacers attached around outside surfaces. The rollers are driven by a motor source (not shown) to rotate about their axes at controllable speeds and thus move the substrate 13. A typical deposition process involves passing the substrate 13 back and forth through the plasma 51 a number of times in order that the thin film deposited on the top of the substrate 13 has a desired uniform thickness.

A magnetron is positioned within the chamber 29, formed of a magnetic structure 55 and a cathode 57. The power supply 17 has its output connected between the cathode 57 and a metallic body of the reaction chamber 29. The magnetron creates an appropriate combination of magnetic and electrical fields in the region 51 in order to create a plasma there when the proper gases are introduced into the reaction chamber 29. The substrate 13 is maintained electrically isolated and is passed directly through the plasma region 51.

The gaseous components necessary for the plasma to form in the region 51 are introduced into the deposition chamber 29 by a conduit 59. A tube (not shown) having a plurality of gas supply nozzles along its length is positioned across the width of the chamber 29 (in a direction into the paper of FIG. 2) at the position where the conduit 59 enters the chamber. That gas flows within the deposition chamber 29 generally from the supply tube to the diffusion pump 39, as shown in dotted outline in FIG. 2. It has been found preferable to introduce the gas on the side of the plasma region 51 that is closest to the pump 39. A pair of baffles 61 and 63 on either side of the magnetron also helps to confine the gas flow to the plasma region 51.

A particular gas supply system 15 that is connected to the conduit 59 depends, of course, on how many gases are being combined and their nature. In the example of FIG. 2, two separate sources 65 and 67 of gases under high pressure are utilized, fewer or additional such gas sources being necessary for other processes. Also, in this particular example, a source 69 of a liquid material to be vaporized is provided. A vaporizing apparatus 71 provides a desired controlled flow of vapor into the input conduit 59, in accordance with a control signal from the system control 25 that operates upon a flow meter that is part of the apparatus 71. Similarly, the high pressure gases 65 and 67 are delivered through individually controlled flow meters 73 and 75, respectively. An important control of the plasma 51, and thus of the resulting film deposited on the substrate 13, is provided by the ability to adjust the proportions of each gaseous component that is flowing through the inlet tube 59 and into the deposition chamber 29. Each of the flow meters 73 and 75, and that in the apparatus 71, supply the system control 25 with an electrical signal proportional to the flow rate of gas through it, and also responds to a signal from the system control 25 to adjust and control that flow rate.

In some applications, particularly in large-scale commercial plasma coating systems, steps are desirably taken to assure a sufficient supply of gases from the supply system 15. In a commercial coater, it is desired that the highest possible deposition rate be achieved without degrading the quality of the deposited thin film. In order to assure that the deposition rate is not limited by the amount of gas that is made available within the reaction chamber 29, the gas supply system 15 and pressure control system 19 need to be adequately sized.

The pressure control system 19 needs to have its mechanical pump 41 and diffusion pump 39 large enough to enable a flow of gases through the reaction chamber 11 sufficient that enough unreacted gas is always available in it. Alternatively, additional such pumps can be added to provide such a flow. To increase the effect of the pump shown in FIG. 2, the baffle 49 at the inlet of the diffusion pump 39 can be removed entirely, thereby causing the diffusion pump 39 to operate unimpeded. The diffusion pump 39 can even be eliminated entirely, and a larger mechanical pump 41 provided, as another alternative to providing the ability to reduce the pressure within the reaction chamber 29.

Of course, in order to take advantage of a given large pumping capability in the pressure control system 19, the gas supply system 15 must be adequately sized. The balance between the pumping ability and source gas supply is chosen to result in the desired operating pressure within the chamber 29, and to assure that the thin film deposition process is not limited in any way by a lack of supply of a reactant gas component. The provision of a plurality of gas inlets to the reaction chamber 11 also allows an increased gas flow rate, as well as a good distribution of fresh gas thoughout the chamber.

Plasma Diagnostics and Control

A primary goal of the system and procedures to be described in this section is to adapt the system described with respect to FIGS. 1 and 2 for use in a continuous, commercially feasible process that repeatably produces thin films having uniform characteristics. A specific example of such a system is described with respect to FIGS. 3–7 herein. In this illustrative example, the liquid 69 is an organosilicon, and the pressurized gases 65 and 67 are oxygen and helium, respectively. The particular organosilicon chosen for illustration is hexamethyldisiloxane (HMDSO), its structure being illustrated in FIG. 4A. The result of this example PECVD process is a thin film that is very hard, scratch resistant, optically clear and adheres well to substrates. Useful applications of this particular thin film include the coating of automobile or architectural glass substrates, either directly on the glass or on top of one or more other thin films such as a sputter deposited low emissivity coating. As will be recognized, this class of substrates is physically large so the process must be able to form a film having uniform characteristics over the entire surface area of each item. However, the diagnoses and control techniques about to be described with respect to such an example have a wide and general application to numerous other specific plasma processes and starting gaseous materials in thin film deposition processes.

FIG. 3 is an example optical emission spectrum obtained by the spectrometer 21 of FIG. 1 from a plasma formed in the process chamber 29 from such a combination of gases. The intensities of three strong emission lines are measured and used to diagnose the characteristic of the plasma and then to make any adjustments to the relative proportion of the gaseous constituents that are required to maintain the plasma in a desired condition. These lines are the hydrogen alpha line 81, at about 657.1 nanometers wavelength, the hydrogen beta line 83, at about 486.1 nanometers wavelength, and a helium emission line 85, at about 501.8 nanometers wavelength. Since these three emission peaks are very strong relative to the intensity of the surrounding portion of the spectra, and are very narrow in bandwidth, the spectrometer 21 need have a resolution capability of only 0.5 nanometers, which is well within the resolving power of commercially available instruments.

In order to eliminate the effects of unknown variables and undesired optical signal noise, ratios of these intensity levels are utilized to diagnose the plasma and control the process. In this example, the ratio of the intensity of the hydrogen alpha line 81 to the intensity of the helium line 85 is used to control the rate of flow of the silicon source material vapor through the flow meter 71. This material is the source of hydrogen whose emission is being monitored. When that ratio exceeds a reference value, the computer control system 25 causes the flow meter within the apparatus 71 to decrease the rate of flow of the silicon material vapor, without affecting the flow rates of the other gases. Also, if that ratio falls below the reference value, the flow meter 71 is opened to increase the flow of the silicon source material vapor.

A second ratio that is utilized is of the intensities of two emission lines of a single atomic or molecular species in the plasma. In this specific example, the intensities of the hydrogen alpha line 81 and the hydrogen beta line 83 are used. As explained below, this ratio is proportional to the average electron energy (average electron temperature $T_e$) of the plasma. If this ratio, or the $T_e$ calculated from it, exceeds a reference value, the computer control 25 causes the flow meter 73 to increase the flow of oxygen without affecting the rate of flow of the silicon source vapor or helium. If the intensity ratio, or the $T_e$ calculated from it, falls below a reference value, the rate of oxygen flow is caused to decrease. A higher proportion of oxygen is believed to cause the average electron energy to decrease by combination with atomic hydrogen which is a primary source of electrons in this gaseous mixture.

The nature of our example plasma will now be explored, and the relationship of the emission line intensity ratios to it will be explained. FIG. 4A illustrates a molecule of the silicon source vapor. It is desired that the portion Si—O—Si be deposited on the substrate. As noted in FIG. 4A, the bond energy between the silicon and oxygen atoms is significantly higher than that of the other bonds in the molecule. That bond strength is 8.31 electron volts (eV). The bond energy between the silicon atom and the methyl group $CH_3$ is 4.53 electron volts. FIG. 4B shows the methyl group with a carbon/hydrogen bond energy of 3.51 electron volts. Therefore, in a plasma having a distribution of high energy electrons colliding with the silicon source molecules, there is a high probability that a collision of an electron with the molecule will cause a methyl group or hydrogen to be fractured away from the rest of the molecule without affecting the Si—O—Si component. The oxygen introduced into the plasma is believed to combine with the hydrogen and the carbon to form various gas and vapor compounds that are exhausted out of the deposition chamber 29 through the diffusion pump 39. This is another benefit of the oxygen component of the plasma gas. In this example, it is desired to minimize, or completely eliminate, any carbon from the deposited film. An inorganic thin film is the goal.

A theoretical Maxwellian distribution of the energies of a population of electrons in the plasma is given in FIG. 5. A solid curve 87 shows one such distribution. The electron population represented by curve 87 has an average energy $T_e$. When the population of electrons have a higher energy, the distribution of energies shifts, such as shown by the dotted curve 89, but retains its basic shape. Similarly, if the overall energy of a population of electrons decreases, the curve shifts to a lower position, such as indicated by the alternate curve 91.

It can be seen from FIG. 5 that the proper position for the electron energy distribution curve is where the density of electrons with energy sufficient to break the Si—C bond is much greater than the density of electrons having an energy great enough to undesirably break the Si—O bond. It can be seen from the shape of the curves of FIG. 5 that this does indeed occur, keeping in mind that the vertical electron density scale is a logarithmic one. Indeed, it has been found that the distribution represented by the solid line 87 is approximately optimum in the example being described, a $T_e$ of slightly over 1.0 being desired.

It will also be noted from FIG. 5 that the three emission lines discussed with respect to FIG. 3 are also represented. The excitation energy that results in the hydrogen alpha line 93 is positioned at about 12 electron volts, that for the hydrogen beta line 95 at about 12.7 electron volts, and that for the helium line 97 at about 23 electron volts. These energies represent that which the hydrogen or helium atom must absorb from a collision with a free electron in order to emit the monitored wavelength of radiation when the atom relaxes from its excited state.

FIG. 6 shows an energy diagram from the hydrogen atom that illustrates this. A collision with an electron of more than 12.07 electron volts can cause the atom to become excited with its electron being moved from a ground energy quantum level $n=1$ to a higher energy quantum level $n=3$. When that excited electron falls to the next lower energy quantum level $n=2$, a hydrogen alpha wavelength photon is emitted. Similarly, a hydrogen beta wavelength photon is emitted when an excited hydrogen atom having collided with an electron of energy greater than 12.73 electron volts relaxes from its excited $n=4$ quantum energy level back to the $n=2$ energy quantum level. As a result, the intensities of these hydrogen emission lines is related to the density of electrons in the plasma having those energy levels. The ratio of the intensities of these hydrogen emission lines then provides a ratio of those densities. This allows a Maxwellian electron density curve to effectively be fit to those two points, from which the average electron temperature $T_e$ may be determined.

However, the high energy "tail" of the electron energy curve of FIG. 5 is desirably separately measured. The hydrogen line intensity ratio is suitable for defining the rest of the curve since the electron densities represented by it are at energy levels in the main part of the energy distribution curve. But the density distribution at higher energy levels can at the same time drop off to very low levels. This is believed due to ineffective energy coupling. Therefore, a separate measurement at a high energy level is also performed. In this example, a helium line of emission is chosen, and that is ratioed with one of the hydrogen lines, preferably the hydrogen alpha line, as a reference. This desired ratio is determined in advance of a deposition process, with the measured ratio being compared to that standard and any adjustments necessary being made in real time.

A quantity of high energy electrons, represented by the "tail" of the curve of FIG. 5, is generally desirable for directly impinging upon the substrate since it is known that this improves the hardness of the resulting deposited film through a higher degree of film cross-linking. Stress in the film also decreases, resulting in better adhesion of the film to the substrate. A low ratio in the plasma emission of the hydrogen alpha line intensity to that of helium predicts these beneficial results.

Use of the helium emission line in forming this second ratio is also advantageous since helium is inert. The gas does not combine with other gas components of the plasma. Any inert gas has this advantage, as well as providing an emission line in the "tail" portion of the curve. An inert gas is used in this example primarily for facilitating an initial source of electrons when the plasma is initiated by establishing the electric field. But it has this additional diagnostic use, as well.

Once it is determined from the measured intensities and ratios that the electron energy distribution curve of FIG. 5 needs to be altered for a process being performed, it can be done in any of a number of ways. Increasing the excitation frequency of the power supply 17 tends to increase the average energy of the electrons, at least up to a point where the electrons can no longer follow the rapidly changing electric field. The power of the supply 17 may affect the electron energy distribution, depending upon the precise geometry of the deposition chamber, an increase in power increasing the electron energy. Another variable that may be adjusted is the total gas flow which changes the residence time of molecules within the plasma and increases the chance of collision. The pressure in the chamber 29 also affects molecular energy, within limits. The technique used in this specific example, however, keeps these variables at a constant level and instead changes the ratio of the flow rate of the individual gases into the reaction chamber 29.

The determination of average electron temperature $T_e$ from the ratio of the alpha and beta hydrogen emission line intensities is very significant. Others have suggested that the determination of electron temperature of a plasma from its emission spectra is very difficult, if not impossible. The mathematical relationships between electron temperature and the intensity of a particular emission line have long been known. However, these mathematical relationships also include additional unknowns such as molecular and electron densities in the plasma. With so many unknowns, it is impossible to use these equations directly to accurately determine electron temperature from an intensity of an emission line. However, if the intensities of two such emission lines from a single species within the plasma are ratioed, as is the case with the ratio of the hydrogen alpha and beta lines, these other variables are mathematically canceled out and no longer affect the result. This calculation assumes a "cold" plasma, one where the average ion energy is very low when compared to the average electron energy.

Referring to FIG. 7, a flow chart is provided of a controlling computer program that monitors the intensities of the three emission lines and make adjustments in the individual gaseous component flow rates as required to maintain the electron temperature distribution within acceptable limits. The process of FIG. 7 can best be described as several functional modules. A first module 101 requires information of both the desired plasma parameters and those that actually exist. It is preferable to enter a desired average electron temperature $T_e$ and then calculate what exists in the plasma, as shown in FIG. 7, since this permits the process operator to deal with known quantities. However, since $T_e$ is proportional to the ratio of the hydrogen alpha and hydrogen beta emission lines, that ratio itself could more simply be substituted in the flow diagram of FIG. 7 where $T_e$ appears. It would then be that line intensity ratio to which the process is adjusted.

If the preferred $T_e$ is maintained as a parameter in the system, a step 103 calculates that quantity. Appendix A hereto provides source code in Basic language for an Apple Macintosh computer to perform the two calculations indicated in that step. This computer program contains material in which a claim of copyright is made by The BOC Group, Inc., assignee of this application, which has no objection to the duplication of Appendix A by photocopying and the like but reserves all other aspects of its copyright therein.

Once the actual and desired quantities are in the system, a next module 105 of the processing algorithm looks at the intensity ratio between the hydrogen alpha and the helium emission lines. A first step 107 compares the actual and desired ratios. If they are within range, then the processing component 105 is omitted completely by jumping to a step 109 in the next module 117. However, if the desired and actual ratios are not equal, a step 111 causes the flow meter 71 to be adjusted to change the flow of silicon source vapor in a direction to move the compared ratios closer together.

A step 113 of the module 105 checks to make sure that the calculated voltage is within the range of the flow meter 71. If it is, the processing proceeds to a step 109. If not, the process loop of module 105 is performed again. If the second calculation also results in a voltage that is not within the range of the flow meter 71, then the processing is stopped and an error message displayed for the operator, as indicated at 115.

Once the silicon source vapor flow rate is adjusted, the next module 117 of the processing adjusts the flow of oxygen to the plasma in response to comparing the desired and actual $T_e$. If those quantities are equal within an acceptable tolerance, then the processing loops back to the beginning module 101 and performs the data acquisition and comparison functions once again, and then steps through the remainder of the program. This constant monitoring of the plasma characteristics allows real time control of the plasma for uniform film results and repeatability of film properties from substrate to substrate.

The program module 117 operates quite similarly to that of 105. If the newly calculated voltage for the oxygen supply flow meter is not within the range of that flow meter, as determined by the step 119, the calculation is made once more in case some error occurred. If the voltage is not within the range the second time, the processing is stopped and an error message displayed. Assuming, however, that the new oxygen flow meter valve control voltage is within its range, the processing is looped back to the beginning module 101 and repeated until the processing modules 101, 105 and 117 have been performed for a total of four times. After the fourth time, and if the last calculation loop resulted in a further adjustment to the oxygen flow meter, a next module 121 of processing is undertaken. After four times through the silicon source and oxygen flow rate adjustments, it is concluded that some other adjustment must be made. Of course, the precise number of processing cycles that are allowed before going to the next calculation module 121 can vary.

The module 121 also looks at $T_e$, but in this case adjusts the helium gas flow to the plasma chamber. An increase of the inert gas supply provides more electrons, and a decrease in the gas fewer electrons. The same check on the calculated voltage for the helium flow meter is made in the module 121 as in the modules 105 and 117, in step 123. Once a proper adjustment to the helium flow is made, the processing again loops back to the beginning module 101 to start the cycle over again.

Appendix B hereto provides source code in the Basic language for an Apple MacIntosh Computer to perform the calculating steps of modules 105, 117 and 121 of FIG. 7. This computer program contains material in which a claim of copyright is made by The BOC Group, Inc., assignee of this application, which has no objection to the duplication of Appendix B by photocopying and the like, but reserves all other aspects of its copyright therein.

Of course, there are many variations in the details of the process being described that can be changed without sacrificing the advantages provided by the basic emission line monitoring techniques that are so implemented. The same techniques are used with other gases and even with a plasma that is part of a thin film sputtering system. In a sputtering system with a titanium target, the intensity of a 399.9 nanometer emission line of titanium and a 301.3 nanometer emission line of titanium-nitride are measured, for example. A ratio of the intensities of these lines is used in the same manner as the hydrogen alpha to helium ratio discussed above. Two line intensities from argon can be used to calculate the average electron temperature in this sputtering example, corresponding to the hydrogen alpha line to hydrogen beta line intensity ratio discussed above for the PECVD example.

Plasma input variables of power of the supply 17 and pressure within the chamber 29 are not included in the algorithm of FIG. 7 as quantities that are adjusted automatically. It has been found satisfactory to maintain those quantities fixed for at least a large processing batch. This is preferably accomplished by setting the control system 25 to the desired power and pressure. The control system 25 is provided with a standard capability of monitoring those quantities and adjusting them, if necessary, to maintain the constant levels that have been set.

The spectra of the plasma 51, an example being given in FIG. 3, is dependent upon the position within the plasma which is observed. That is, the intensities of the three emission peaks 81, 83 and 85, both absolutely and relatively, are different depending upon where the end of the optical fiber 23 is positioned with respect to the quartz window 24 (FIG. 1) of the reaction chamber 11. So long as this position remains fixed and the intensity distribution across the plasma 51 does not change, the techniques of controlling that process described above optimizes it. But if it is desired to use that same process control on a different piece of equipment, for example, it is likely that the plasma will be viewed at a location with a different emission spectrum. Thus, the control system which has been optimized for one plasma emission spectrum may have to be recalibrated to operate with a spectrum having different relative intensities of peaks of interest than in the plasma for which the control system was optimized. Also, even in a single machine, the spectrum can change across the plasma due to a change in the substrate being coated, primarily in its thickness, any change of gases, gas flow rates, a pumping rate change, some relative change in the electrical power being delivered to the system, and similar matters.

Therefore, to further optimize the control of the plasma deposition process, a technique illustrated with respect to FIGS. 8–10 maintains an end of the optical fiber medium 23 to gather light from the same relative position in the plasma, regardless of any such changes. As a preferred location, since it is relatively easy to locate for any plasma, the optical fiber 23 is positioned to view the plasma at the location where the ratio of the intensities of emission into relevant narrow band-widths is a maximum. In the example being described, that ratio is preferred to be the intensity of the hydrogen alpha line divided by the intensity of the helium line of emission.

Referring to FIGS. 8 and 9, a mechanism will be described for moving the optical fiber cable 23 with respect to the transparent window 24 of the reaction chamber in order to maintain this ratio at a maximum. The optical fiber cable 23 is preferably terminated in a long, small diameter cylindrical tube 301. The cable preferably contains dozens of individual optical fibers. The purpose of the tube 301 is to limit the natural cone angle of acceptance of light of the optical fiber end so that it accepts substantially collimated light rays emitted from an area of the plasma 51 that is substantially the same size as the size of the opening of the tube 301 at an end adjacent the quartz window 24. The inside of the tube 301 is made to be highly reflective.

The light-guiding tube 301 is attached to a support block 303 that is carried with respect to the reaction chamber 11 in a manner that allows it to be moved in both X and Y directions. Appropriate control motors are used to provide such movement. An example is the use of separate X and Y direction drive motors 305 and 307, respectively, that drive the support block 303 through respective mechanical connections 309 and 311 to move the block 303 in those two directions. The motors 305 and 307 are controlled by position control circuits 313 which are in turn connected to the system computer control 25 (FIG. 1) by an appropriate circuit 315.

The block 303 can then easily be controlled to move the optical fiber end tube 301 to a position to view the plasma 51 where the ratio of the intensity of the hydrogen alpha line to that of the helium line is a maximum. This adjustment can be made as frequently as each time a substrate is placed into the reaction chamber, or, more practically, on a periodic basis or when the nature of the substrate to be coated significantly changes.

A number of specific ways of determining the desired location may alternatively be implemented by the mechanism of FIGS. 8 and 9. One way is to scan the fiber cable tube 301 in some raster pattern across the window 24, while the computer control system 25 calculates a desired ratio from information obtained at several locations of each raster scan line. The location of the block 303 where the ratio is maximized is then determined and the block returned to that position for monitoring the plasma.

Another one of many ways of determining the maximum intensity ratio location is illustrated in FIG. 10. As a first step, the tube 301 is located at four spaced apart positions indicated at 317, 319, 321, and 323. The ratio of intensities is calculated for each of those locations and the maximum determined. Assuming that maximum in this example was obtained at the location 321, then the tube 301 is positioned at four other locations spaced around the position 321, such as positions 325, 327, 329 and 331. The maximum intensity ratio for each of these four locations is noted, and another four locations tested around that location, and so forth.

Of course, as an alternative to the mechanism described with respect to FIGS. 8–10, the fiber cable tube 301 can be adjusted in some manner by hand, while the operator is observing the desired intensity ratio which is being calculated by the system's computer.

Magnetron Structures

The magnetron used in the plasma chamber 29 can be of a usual planar magnetron form, a representation of which is given in FIG. 11A. A cross-sectional view of the magnet structure 55 is provided at a vertical plane. In plan view, the structure of FIG. 11 is elongated in a direction normal to the plane of the paper.

The structure of FIG. 11A is termed a balanced magnetron. Its magnetic lines of force 131 all travel between one of the outer south magnetic poles and a central north pole. As is well known, electrons and ions travel in a spiral around a magnetic force line and along it, under influence of a combination of the magnetic field forces and the electric field forces formed by the cathode and the process chamber metal case. This type of magnetron is particularly useful in sputtering applications where a high density of ions and electrons are desired near the cathode 57. In a sputtering system, it is desired to have as many ions as possible strike the cathode in order to dislodge material from the cathode that is then deposited on a substrate. In the PECVD case, however, it is desired that the substrate 13 be within the plasma. The cathode 57 is generally made of titanium or quartz which have low sputtering yields. Sputtering is further minimized by the use of lower power densities and higher pressures in the deposition system of FIG. 2 than in conventional magnetron sputtering. Such sputtering is typically performed at a pressure in a range of about 1-5 microns, while the PECVD process described above is typically performed at a pressure in a range of about 43-49 microns.

An unbalanced magnetron that alternatively can be utilized in the system of FIG. 2 is shown in FIG. 12A. Outside magnets 133 and 135 are arranged with a soft iron core 137 middle. Only the south magnetic poles are positioned against a cathode 57', the north pole faces being oriented away from the cathode. The result is that a substantial proportion of the magnetic field lines follow a much longer path in extending between the magnetic south and north pole regions. Only a small proportion of the force lines extend directly between the outer south pole faces and the central iron core piece. The result is a pattern of magnetic field lines, such as lines 139 of FIG. 12A, which are directed toward the substrate 13, most of them substantially perpendicular to its surface. The result is a beneficial bombardment by ions and electrons in the plasma against the surface of the substrate 13. This is known to improve some properties of the resulting deposited film, such as its hardness. Also, the deposition rate has been found to be much better with an unbalanced magnetron structure of FIG. 12A rather than the balanced magnetron structure of FIG. 11A.

The balanced and unbalanced magnetrons have their relative magnetic field strength distribution across the cathode indicated schematically by diagrams of FIGS. 11B and 12B, respectively. As can be seen in FIG. 11B, the component of the magnetic field strength perpendicular to the cathode in the center is twice the field strength of the outer poles. In the unbalanced magnetron case of FIG. 12B, however, the center field strength component is very weak compared to the field strength component of each of the outer magnetic poles. This difference in field strength distribution across the cathode results in the different distribution of the magnetic flux lines 139.

The magnetron structures of FIGS. 11A and 12A are suitable for low frequency operation of the power supply 17. An example frequency is 40 kHz. However, there can be some advantages from operating at a much higher frequency, such as in the radio frequency range of several megahertz. Such a high frequency system is schematically illustrated in FIG. 13. A magnetron magnetic assembly 55″ may be either of the balanced or unbalanced types described previously, the unbalanced type being preferred. The cathode 57″ is in this case made of a non-conductive quartz material. A radio frequency generator 141 has its output coupled to the cathode 57″ by a rod 143. An impedance matching network 145 is connected between the RF generator and the coupling rod 143 in order to minimize any reflections from impedance discontinuities at the cathode 57″.

Vaporizer Structure

Turning to FIG. 14, the vaporizing apparatus 71 comprises a fluid passageway 212 defining an inlet 214 and an outlet 216. Inlet 214 is where the liquid is introduced into vaporizing apparatus 71 from a liquid source 69, or reservoir, and outlet 216 is where controlled flow of the vaporized liquid may be delivered to an associated vacuum system or other desired system.

Means 220 for pumping metered quantities of the liquid is in fluid communication with the passageway 212 and is adjacent to inlet 214. Pumping means 220 may be a metering pump 222 disposed downstream of inlet 214. For example, when vaporizing apparatus 71 is intended to deliver flow rates between about 1 and 100 SCCM (standard cubic centimeters per minute), then metering pump 222 should pump about 1 to 100 microliters per cycle. Where a vapor pressure of about 160 Torr is desired downstream, then the metering pump 222 will typically pump about once or twice per minute. The pumping rate is preferably controlled by a pressure sensor 224 downstream of pumping means 220 and in fluid communication with passageway 212.

As may be seen in FIG. 14, means 226 for vaporizing the liquid is in fluid communication with passageway 212 downstream of pumping means 220.

Turning to FIG. 15, vaporizing means 226 preferably includes a heat sink layer 228, a heated layer 234, and a portion 212a of passageway 212 is sandwiched therebetween so as to thermally transfer excess heat from heated layer 234 to heat sink layer 228.

Passageway portion 212a must be of a length sufficient for vapor buildup in order to deliver substantially continuous vapor flow downstream of vaporizing means 226. For example, when delivering vapor flows of between about 1 to 100 SCCM, a length of at least about 7 inches when portion 212a is 0.25 inch in diameter is sufficient, and more preferably the portion 212a is about two to three feet.

Heat sink layer 228 is formed of a highly heat conductive material, such as for example, copper configured as tubing 230. When heat sink layer 228 is tubing 230, then passageway portion 212a is preferably wound in a spiral along the outer surface 232 of tubing 230.

Passageway portion 212a must be in good thermal contact with heat sink layer 228, such as by silver soldering to tubing 230. An inside 235 of tubing 230 may be left open to ambient air in order to permit the excess absorbed heat from passageway portion 212a to be dissipated.

Heat sink layer 228 is preferably tubing 230 due to availability for fabrication, but could be planar or differently configured. Vapor exits vaporizing means 226 in passageway 212 when associated with a vacuum system for vapor deposition typically at a vapor pressure of about 160 Torr.

Heated layer 234 may be composed of a flexible, resistant wire wrapped in a high heat resistant covering, sometimes hereinafter referred to as "heating tape". Heated layer 234 is operatively associated with a temperature controller 240 adapted to maintain heated layer 234 at a temperature above the boiling point of the liquid, and where heating tape is used, is heated by power supply 241. For example, useful liquids for plasma enhancement deposition include vinyltrimethylsilane, with a boiling point of 55.5° C., and hexamethyldisilizane, with a boiling point of 127° C. Temperature controller 240 preferably includes a thermocouple 242 that is attached, as by soldering, to heat sink layer 228, and is preferably located near an output 244 of vaporizing means 226.

Vaporizing means 226 preferably further includes a thermal barrier layer 246 enveloping a portion 234a of heated layer 234 adjacent output 244 and may be formed, for example, of a glass fiber blanket covered by aluminum foil. Where, for example, heat sink layer 228 is configured as tubing 230, then portion 234a may be about half of the length of tubing 230. Thermal barrier layer 246 functions to ensure that vaporized liquid exiting passageway portion 212a does not condense.

Returning to FIG. 14, upstream of outlet 216 is means 260 for flowing the vaporized liquid at a predetermined flow rate towards outlet 216. Flowing means 260 preferably includes a control valve 262 and a flow meter 264. Control valve 262 may be a solenoid valve or a piezoelectric valve. Flow meter 264 is adapted to compare a preselected flow rate with an actual output and to make appropriate corrections until the flow output equals the preselected input. A preferred flow meter 264 operates as described by U.S. Pat. 4,464,932, issued Aug. 14, 1984, inventors Ewing et al., incorporated herein by reference.

Flow meter 264 is in an electronic feedback loop with control valve 262, so as to electronically signal the opening and closing control valve 262 to prevent condensation of the vapor within flow meter 264. It is important that control valve 262 be upstream of flow meter 264 because if control valve 262 were downstream of flow meter 264, then vapor could condense in flow meter 264 due to insufficient pressure drop. Control valve 262 functions to physically impede the vapor flow by increasing or decreasing a restriction in the passageway. Although control valve 262 is preferably electronically actuated, it could be a manually operated needle valve or the like.

In addition to the necessary pumping means 220, vaporizing means 226 and flowing means 260, vaporizing apparatus 71 preferably includes means 270 for isolating the vaporized liquid from outlet 216 upstream of the flowing means 260. Isolating means 270 may be a bellows valve 272 in fluid communication with passageway 212. In addition, means 274 for controlling a pressure drop in passageway 212, such as a needle valve 276, preferably is in fluid communication with passageway 212, preferably upstream of the flowing means 260 and downstream of the isolating means 270. Controlling means 274 may be a fixed constriction in passageway 212, because a constriction could cause enough pressure drop so that even at room temperature the vapor would not condense. For example, a sufficient pressure drop when the vaporized liquid is at 160 Torr with a flow rate of about 10 to about 100 SCCM to 0.01 Torr. However, use of needle valve 276 as the controlling means 274 permits adjustable control of the pressure drop, since the associated micrometer permits very fine adjustments for the flow conductance. Thus, the vaporizing apparatus can be used for a variety of volatile liquids.

If the vaporizing apparatus 71 is not associated with a vacuum system, for example where outlet 216 delivers vapor into a system at atmospheric pressure, then instead of the exemplified 160 Torr, the pressure should be at about 1,000 Torr, and the controlling means 274 would be set for a pressure drop to about 900 Torr.

The exemplified deposition chamber 29 had a size of 12 inches by 12 inches by 24 inches, and the vaporizing apparatus 71 is believed to have a maximum flow rate of about 700 SCCM for this dimensional scale which should be adequate for most applications. However, the vaporizing apparatus 71 is not limited to the exemplified dimensions since it can be readily scaled up.

Although the various aspects of the present invention have been described with respect to its preferred embodiments, it will be understood that the invention is entitled to protection within the full scope of the appended claims.

APPENDIX A

© 1986, The BCC Group, Inc.

```
'This subroutine is called when the measure button is selected
on ameasure:
TEXTMODE 0
    LPRINT "DMA III - Plasma Control Rev.1.0"
    LET today$=DATE$
    LPRINT today$
    LET chrono$=TIME$
    LPRINT chrono$
    IF printexpvalues <> 1 THEN GOTO 5
    LPRINT "Experiment #",expnumber$
    LPRINT "Power",powers$;"watts"
    LPRINT "Pressure",pressure$;"microns"
    LPRINT "Flow ",flow1$
    LPRINT "",flow2$
    LPRINT "Comments",comment1$
    LPRINT "",comment2$
    LPRINT "Plasma Type",gas$
```

```
5 LPRINT "Measurement #",prun
  printexpvalues=printexpvalues +1

PRINT #1,"TERM;CR"
    PRINT #1,"OUTPUT 17;DATA"
    PRINT #1,"OUTPUT 17;STOP"
    PRINT #1,"OUTPUT 17;ACC-B"

sixpeak$=""
  IF plasmatype=1 THEN a=655
  IF plasmatype=2 THEN a=615
  IF plasmatype=3 THEN a=634
    a$=STR$(a)
    PRINT #1,"OUTPUT 17;X="a$""
    PRINT #1,"OUTPUT 17;C"
    PRINT #1,"ENTER17;CR"
    LINE INPUT #1,c$
    c=VAL(c$)
    c=c+1
  FOR I%=1 TO 10
    a$=STR$(c)
    PRINT #1,"OUTPUT 17;C="a$""
    PRINT #1,"OUTPUT 17;L"
    PRINT #1,"ENTER17;CR"
    LINE INPUT #1,peak$
    IF VAL(peak$)>VAL(sixpeak$) THEN sixpeak$=peak$
    c=c+1
  NEXT I%
    sixpeak=VAL(sixpeak$)
    LOCATE 11,16
  PRINT sixpeak
  IF plasmatype=1 THEN LPRINT "657 Peak (H alpha)",sixpeak
  IF plasmatype=2 THEN LPRINT "617 Peak",sixpeak
  IF plasmatype=3 THEN LPRINT "636 Peak",sixpeak helpeak$=""
  IF plasmatype=1 THEN a=585
  IF plasmatype=2 THEN a=484
  IF plasmatype=3 THEN a=595
    a$=STR$(a)
    PRINT #1,"OUTPUT 17;X="a$""
    PRINT #1,"OUTPUT 17;C"
    PRINT #1,"ENTER17;CR"
    LINE INPUT #1,c$
    c=VAL(c$)
    c=c+1
  FOR I%=1 TO 10
    a$=STR$(c)
    PRINT #1,"OUTPUT 17;C="a$""
    PRINT #1,"OUTPUT 17;L"
    PRINT #1,"ENTER17;CR"
    LINE INPUT #1,peak$
    IF VAL(peak$)>VAL(helpeak$) THEN helpeak$=peak$
```

```
        c=c+1
    NEXT I%
    he1peak=VAL(he1peak$)
     IF plasmatype=1 THEN LPRINT "587 Peak (He)",he1peak
     IF plasmatype=2 THEN LPRINT "488 Peak",he1peak
     IF plasmatype=3 THEN LPRINT "597 Peak",he1peak
    LOCATE 13,16
    IF plasmatype=1 THEN PRINT (he1peak)
    IF plasmatype=2 OR plasmatype=3 THEN LOCATE 12,16:PRINT he1peak
    IF plasmatype=1 THEN LPRINT "587/657",(he1l1/1000)

he2peak$=""
     IF plasmatype=1 THEN a=501
     IF plasmatype=2 THEN a=432
     IF plasmatype=3 THEN a=555
        a$=STR$(a)
        PRINT #1,"OUTPUT 17;X="a$""
        PRINT #1,"ENTER17;CR"
        LINE INPUT #1,c$
        c=VAL(c$)
        c=c+1
FOR I%=1 TO 10
        a$=STR$(c)
        PRINT #1,"OUTPUT 17;C="a$""
        PRINT #1,"OUTPUT 17;L"
        PRINT #1,"ENTER17;CR"
        LINE INPUT #1,peak$
        IF VAL(peak$)>VAL(he2peak$) THEN he2peak$=peak$
        c=c+1
    NEXT I%
    he2peak=VAL(he2peak$)
     IF plasmatype=1 THEN LPRINT "502 (He) Peak",he2peak
     IF plasmatype=2 THEN LPRINT "434 Peak",he2peak
     IF plasmatype=3 THEN LPRINT "558 Peak",he2peak
    LOCATE 12,16
    heh2=(sixpeak/he2peak)
    heh=INT((heh2*1000))
    IF plasmatype=1 THEN PRINT (heh/1000):LPRINT "H(alpha)/He",(heh/1000)
    IF plasmatype=2 OR plasmatype=3 THEN LOCATE 13,16:PRINT he2peak endpeak$=""
    IF plasmatype=1 THEN a=484
    IF plasmatype=2 THEN a=413
    IF plasmatype=3 THEN a=524
        a$=STR$(a)
        PRINT #1,"OUTPUT 17;X="a$""
        PRINT #1,"OUTPUT 17;C"
        PRINT #1,"ENTER17;CR"
        LINE INPUT #1,c$
        c=VAL(c$)
        c=c+1
FOR I%=1 TO 10
```

```
        a$=STR$(c)
        PRINT #1,"OUTPUT 17;C="a$""
        PRINT #1,"OUTPUT 17;L"
        PRINT #1 ,"ENTER17;CR"
        LINE INPUT #1,peak$
        IF VAL(peak$)>VAL(endpeak$) THEN endpeak$=peak$
        c=c+1
NEXT I%
endpeak=VAL(endpeak$)
    IF plasmatype=1 THEN LPRINT "486 (H beta) Peak",endpeak
    IF plasmatype=2 THEN LPRINT "410 Peak",endpeak
    LOCATE 14,1c
    heh3=(endpeak/sixpeak)
    hen1=INT((heh3*1000))
    IF plasmatype=1 THEN PRINT (endpeak)
    IF plasmatype=2 OR plasmatype=3 THEN PRINT endpeak
    IF plasmatype=1 THEN LPRINT "(H beta)",(endpeak)
    heh10=(sixpeak/endpeak)
    heh0=INT(heh10*1000)
    IF plasmatype=1 THEN LOCATE 15,16:PRINT (heh0/1000)
    IF plasmatype=1 THEN LPRINT "H(alpha)/H(beta)",(heh0/1000)
        PRINT #1,"OUTPUT 17;X=451.298"
        PRINT #1,"OUTPUT 17;L"
        PRINT #1 ,"ENTER17;CR"
        LINE INPUT #1,thistime$
        LPRINT "449.8 (451.298)(H2):",VAL(thistime$)
        PRINT #1,"OUTPUT 17;X=439.252"
        PRINT #1,"OUTPUT 17;L"
        PRINT #1 ,"ENTER17;CR"
        LINE INPUT #1,THISTIMEE$
        LPRINT "439.1 (O):",VAL(THISTIMEE$)
        LPRINT ""
        LPRINT ""
    IF store=0 THEN GOTO 50
    IF prun=1 THEN label$=expnumber$
    IF prun<>1 THEN label$=STR$(prun)
    IF skipon=1 AND skip>0 THEN GOTO 50
        PRINT #1,"OUTPUT 17;LABEL "label$""
        PRINT #1,"OUTPUT 17;STORE "file$";0"
        LPRINT "File Stored on Floppy 0 File # ";file$
        file=VAL(file$)
        file=file+1
        file$=STR$(file)
50  prun=prun+1
    skip=skip-1
    IF skip=0 THEN skip=VAL(skip$)
omatea=0
kTe=.001
Ia=sixpeak
Ib=endpeak
WHILE omatea=0
  omatec=(2.24)+(-1.93)+(LOG(Ia/Ib))-((.66)*(1/kTe))+((kTe)*(-8.57^-3))+((kTe^2)*(1.37^-3))+((kTe
^3)*(-2.24^-4))+((kTe^4)*(3.615^-5))
```

```
   kTe=kTe+.1
   IF INT(om atec)=1 THEN om atea=1
   WEND
om ateb=0
WHILE om ateb=0
   om ated=(2.24)+(-1.93)+(LOG(Ia/Ib))-((.66)*(1/kTe))+((kTe)*(-8.59^-3))+((kTe^2)*(1.37^-3))+((kTe^3)*(-2.24^-4))+((kTe^4)*(3.615^-5))
   kTe=kTe+.01
   IF INT(om ated)=1 THEN om ateb=1
   WEND
om ater=0
kTe=kTe-(kTe*.015)
WHILE om ater=0
   om ates=(2.24)+(-1.93)+(LOG(Ia/Ib))-((.66)*(1/kTe))+((kTe)*(-8.59^-3))+((kTe^2)*(1.37^-3))+((kTe^3)*(-2.24^-4))+((kTe^4)*(3.615^-5))
   kTe=kTe+.001
   IF INT(om ates)=1 THEN om ater=1
   WEND
   LPRINT ""
ktee=kTe*1000
kteee=INT(ktee)
kTe=kteee/1000
LPRINT "Te",kTe,"eV"
LOCATE 5,16
PRINT kTe;"eV"
   om aused=1
   PRINT #1,"OUTPUT 18;N061X"
   PRINT #1,"OUTPUT 18;N071X"
   PRINT #1,"OUTPUT 18;N054X"
   PRINT #1,"OUTPUT 18;B053X"
   PRINT #1,"OUTPUT 18;C053X"
RETURN om ahydrogenelectron:
   LPRINT "OMA III - Plasma Control Rev.1.0"
   LPRINT "Electron Temperature"
   LET today$=DATE$
   LPRINT today$
   LET chrono$=TIME$
   LPRINT chrono$ PRINT #1,"TERM;CR"
   PRINT #1,"OUTPUT 17;DATA"
   PRINT #1,"OUTPUT 17;STOP"
   PRINT #1,"OUTPUT 17;ACC-B"
   sixpeak$=""
   IF plasmatype=1 THEN a=655
   a$=STR$(a)
   PRINT #1,"OUTPUT 17;X="a$""
   PRINT #1,"OUTPUT 17;C"
   LINE INPUT #1,c$
   c=VAL(c$)
   c=c+1
```

```
FOR I%=1 TO 10
    a$=STR$(c)
    PRINT #1,"OUTPUT 17;C="a$""
    PRINT #1,"OUTPUT 17;L"
    PRINT #1 ,"ENTER17;CR"
    LINE INPUT #1,peak$
    IF VAL(peak$)>VAL(sixpeak$) THEN sixpeak$=peak$
    c=c+1
NEXT I%
    sixpeak=VAL(sixpeak$)
    LOCATE 11,16
   PRINT sixpeak
   IF plasmatype=1 THEN LPRINT "657 Peak (H alpha)",sixpeak
   endpeak$=""
   IF plasmatype=1 THEN a=484
       a$=STR$(a)
    PRINT #1,"OUTPUT 17;X="a$""
    PRINT #1,"OUTPUT 17;C"
    PRINT #1 ,"ENTER17;CR"
    LINE INPUT #1,c$
    c=VAL(c$)
    c=c+1
FOR I%=1 TO 10
    a$=STR$(c)
    PRINT #1,"OUTPUT 17;C="a$""
    PRINT #1,"OUTPUT 17;L"
    PRINT #1 ,"ENTER17;CR"
    LINE INPUT #1,peak$
    IF VAL(peak$)>VAL(endpeak$) THEN endpeak$=peak$
    c=c+1
NEXT I%
endpeak=VAL(endpeak$)
   IF plasmatype=1 THEN LPRINT "486 (H beta) Peak",endpeak
   LOCATE 14,16
   IF plasmatype=1 THEN PRINT (endpeak)
   IF plasmatype=1 THEN LPRINT "(H beta)",(endpeak)
   heh10=(sixpeak/endpeak)
   heh0=INT(heh10*1000)
   IF plasmatype=1 THEN LOCATE 15,16:PRINT (heh0/1000)
   IF plasmatype=1 THEN LPRINT "H(alpha)/H(beta)",(heh0/1000)
omatea=0
kTe=.001
Ia=sixpeak
Ib=endpeak
WHILE omatea=0
   omatec=(2.24)+(-1.93)+(LOG(Ia/Ib))-((.60)*(1/kTe))+((kTe)*(-8.57^-3))+((kTe^2)*(1.37^-3))+((kTe
^3)*(-2.24^-4))+((kTe^4)*(3.615^-5))
   kTe=kTe+.1
   IF INT(omatec)=1 THEN omatea=1
   WEND
omateb=0
kTe=kTe-.5
WHILE omateb=0
```

```
om ated=(2.24)+(-1.93)+(LOG (Ia/Ib))-((.66)*(1/kTe))+((kTe)*(-8.57^-3))+((kTe^2)*(1.39^-3))+((k
^3)*(-2.24^-4))+((kTe^4)*(3.615^-5))
   kTe=kTe+.01
   IF INT(om ated)=1 THEN om ateb=1
   W END
om ater=0
kTe=kTe-(kTe*.015)
WHILE om ater=0
   om ates=(2.24)+(-1.93)+(LOG (Ia/Ib))-((.66)*(1/kTe))+((kTe)*(-8.57^-3))+((kTe^2)*(1.37^-3))+((k
^3)*(-2.24^-4))+((kTe^4)*(3.615^-5))
   kTe=kTe+.001
   IF INT(om ates)=1 THEN om ater=1
   W END
   LPRINT ""
ktee=kTe*1000
kteee=INT(ktee)
kTe=kteee/1000
LPRINT "Te",kTe,"eV"
LOCATE 5,16
PRINT "Te";kTe;"eV"
   om aused=1
   PRINT #1,"OUTPUT 18;N061X"
   PRINT #1,"OUTPUT 18;N071X"
   PRINT #1,"OUTPUT 18;N054X"
   PRINT #1,"OUTPUT 18;B053X"
   PRINT #1,"OUTPUT 18;C053X"
RETURN
```

APPENDIX B

© 1987, The BOC Group, Inc.

```
IF VAL(heflow $)=0 THEN testthis=0 :senseuse=0
IF VAL(heflow $)>0 THEN testthis=1 :senseuse=1
IF senseuse=1 AND controlheflow $="no" OR controlheflow $="NO" THEN controlheflow =0
EDIT FIELD CLOSE 4
EDIT FIELD CLOSE 5
IF testthis=0 THEN BUTTON CLOSE 10
BUTTON CLOSE 4
BUTTON CLOSE 5
BUTTON 1,1
BUTTON 2,1
BUTTON 3,1
BUTTON 11,1
RETURN hm dsocontrol:
DIALOG OFF
MENU OFF
TIMER OFF
WINDOW 2,"",(50,50)-(450,250),2
  WINDOW OUTPUT WINDOW (1)
     BUTTON 20,1,"OK",(350,170)-(390,190),1
     BUTTON 21,1,"CANCEL",(10,170)-(100,190),1
```

```
    LOCATE 2,11
    TEXTSIZE (18)
    PRINT "FLOW CONTROL PROGRAM"
    TEXTSIZE(12)
    LOCATE 3,19
    PRINT "(Revision #2.0F)"
    TEXTSIZE(10)
    LOCATE 7,1
    PRINT "This section allows the control of the silicon-source flow . Either the"
    LOCATE 8,1
    PRINT "flow can be selected and maintained,or a desired Halpha/He ratio selected"
    TEXTSIZE(12):LOCATE 8,1
    PRINT "PLEASE SELECT FLOW CONTROL DESIRED:"
    EDIT FIELD 1,"",(295,110)-(370,125),1,1
    LOCATE 9,15
    PRINT "Halpha/He enter          1"
    LOCATE 10,15
    PRINT "For Flow only enter      2"
    ef=1
    dialogactive=1
    buttonevent=0
    WHILE dialogactive
       eventtype=DIALOG(0)
       buttonevent=DIALOG(1)
       IF eventtype=1 AND buttonevent=20 THEN dialogactive=0
       IF eventtype=1 AND buttonevent=21 THEN dialogactive=0:WINDOW CLOSE 2:GOSUB screen1:R
ETURN
       IF eventtype=6 THEN dialogactive=0
       IF eventtype=2 THEN ef=DIALOG(2)
    WEND
    flow type=0
    gas$=EDIT$(1)
    IF gas$="1" THEN flow type=1
    IF gas$="2" THEN flow type=2
    IF flow type=0 THEN WINDOW CLOSE 2:GOSUB screen 1:WINDOW OUTPUT WINDOW (1):RETURN
    EDIT FIELD CLOSE 1
    WINDOW CLOSE 2
    WINDOW OUTPUT WINDOW (1)
WINDOW 3,"",(200,100)-(450,200),2
    TEXTMODE 1
    WINDOW OUTPUT WINDOW (1)
    BUTTON 1,1,"OK",(30,70)-(70,95),1
    BUTTON 2,1,"Cancel",(100,70)-(175,95),1
3000   ef=1
   dialogactive=1
   buttonevent=0
   LOCATE 2,2
   TEXTSIZE(12)
   IF flow type=1 THEN PRINT "Desired Halpha/He:"
   IF flow type=2 THEN PRINT "Desired Flow Rate (sccm):"
   EDIT FIELD 1,"",(180,35)-(220,50),1,1
   EDIT FIELD 2,"",(180,15)-(220,30),1,1
   IF flow type=1 THEN LOCATE 3,6:PRINT "Desired Te"
WHILE dialogactive
    eventtype=DIALOG(0)
    buttonevent=DIALOG(1)
    IF eventtype=1 AND buttonevent=1 THEN dialogactive=0
```

```
   IF eventtype=1 AND buttonevent=2 THEN dialogactive=0:WINDOW CLOSE 3:GOSUB screen1:RE
TURN
   IF eventtype=6 THEN dialogactive=0
   IF eventtype=2 THEN ef=DIALOG(2)
 WEND
 IF flow type=1 THEN halphahe$=EDIT$(2)
 IF flow type=2 THEN flow rate$=EDIT$(2)
 IF flow type=1 THEN teset$=EDIT$(1):teset=VAL(teset$)
 halphahe=VAL(halphahe$)
 flow rate=VAL(flow rate$)
 IF flow type=2 THEN VOLTNOW =(flow rate+1.514)/17.69
 IF flow type=1 AND (halphahe<.25 OR halphahe>6) THEN TEXTFACE (1):LOCATE 4,2:PRINT "Incor
rect Value":TEXTFACE (0):GOTO 3000
 IF flow type=2 AND (flow rate<5 OR flow rate>100) THEN TEXTFACE (1):LOCATE 4,2:PRINT "Inco
rrect Value":TEXTFACE (0):GOTO 3000
 WINDOW CLOSE 3
 WINDOW OUTPUT WINDOW (1)
 IF flow type=1 THEN GOSUB controlon
 IF flow type=1 AND returning=1 THEN CONTROLPRINT=0:GOTO 3046
 IF flow type=1 AND VAL(sisourceflow $)>0 THEN VOLTNOW =((VAL(sisourceflow $))+1.514)/17.69
 IF flow type=1 AND VAL(oxygenflow $)>0 THEN ovoltnow =((VAL(oxygenflow $))+12.68)/216.7
 IF flow type=1 AND VAL(heflow $)>0 THEN hevoltnow =((VAL(heflow $))-.6455)/19.81
 VOLTNOW $=STR$(VOLTNOW )
 ovoltnow $=STR$(ovoltnow )
 hevoltnow $=STR$(hevoltnow )
 HP$=hevoltnow $
 PRINT #1,"OUTPUT 13;V"VOLTNOW $"F1X"
 PRINT #1,"OUTPUT 10;V"ovoltnow $"F1X"
 PRINT #1,"TERM;CR LF"
 PRINT #1,"OUTPUT 05;VSET "HP$""
 PRINT #1,"TERM;CR"
   m inustenpercent=halphahe-(halphahe*.1)
   m inusfivepercent=halphahe-(halphahe*.05)
   m inusonepercent=halphahe-(halphahe*.01)
   m inusonehalfpercent=halphahe-(halphahe*.005)
   m inusonequarterpercent=halphahe-(halphahe*.0025)
   m inusonetenthpercent=halphahe-(halphahe*.001)
   plustenpercent=halphahe+(halphahe*.1)
   plusfivepercent=halphahe+(halphahe*.05)
   plusonepercent=halphahe+(halphahe*.01)
   plusonehalfpercent=halphahe+(halphahe*.005)
   plusonequarterpercent=halphahe+(halphahe*.0025)
   plusonetenthpercent=halphahe+(halphahe*.001)
   tem inustenpercent=teset-(teset*.1)
   tem inusfivepercent=teset-(teset*.05)
   tem inusonepercent=teset-(teset*.01)
   tem inusonehalfpercent=teset-(teset*.005)
   tem inusonequarterpercent=teset-(teset*.0025)
   tem inusonetenthpercent=teset-(teset*.001)
   teplustenpercent=teset+(teset*.1)
   teplusfivepercent=teset+(teset*.05)
   teplusonepercent=teset+(teset*.01)
   teplusonehalfpercent=teset+(teset*.005)
   teplusonequarterpercent=teset+(teset*.0025)
   teplusonetenthpercent=teset+(teset*.001)
   Fm inustenpercent=flow rate-(flow rate*.1)
   fm inusfivepercent=flow rate-(flow rate*.05)
```

```
   fm inusonepercent=flow rate-(flow rate*.01)
   fm inusonehalfpercent=flow rate-(flow rate*.005)
   fm inusonequarterpercent=flow rate-(flow rate*.0025)
   fm inusonetenthpercent=flow rate-(flow rate*.001)
   Fplustenpercent=flow rate+(flow rate*.1)
   fplusfivepercent=flow rate+(flow rate*.05)
   fplusonepercent=flow rate+(flow rate*.01)
   fplusonehalfpercent=flow rate+(flow rate*.005)
   fplusonequarterpercent=flow rate+(flow rate*.0025)
   fplusonetenthpercent=flow rate+(flow rate*.001)
   flow controlonnow =1
LOOPFORCONTROL=1 !
3005 IF flow type=2 THEN GOTO 3045
PRINT #1,"TERM ;CR"
PRINT #1 ,"OUTPUT 17;DATA"
PRINT #1 ,"OUTPUT 17;STOP"
exposureover=0
printw ave=0
testtime=0
3007
     IF exposureover=0 THEN PRINT #1,"OUTPUT 17;ACC-B"
     IF exposureover=1 THEN PRINT #1,"OUTPUT 17;LIVE-B"
     IF exposureover=1 THEN PRINT #1,"OUTPUT 17;STOP"
3008  IF LOOPFORCONTROL=1 THEN PRINT #1,"OUTPUT 17;X=655"
     IF LOOPFORCONTROL=2 THEN PRINT #1,"OUTPUT 17;X=484"
     IF LOOPFORCONTROL=3 THEN PRINT #1,"OUTPUT 17;X=500"
PRINT #1,"OUTPUT 17;C"
PRINT #1 ,"ENTER17;CR"
LINE INPUT #1,C$
PRINT #1,"OUTPUT 17;L"
PRINT #1 ,"ENTER17;CR"
LINE INPUT #1,wavelen$
w avelen=VAL(w avelen$)
C=VAL(C$)
C=C+1
C$=STR$(C)

PRINT #1,"OUTPUT 17;C="C$""
PRINT #1,"OUTPUT 17;L"
PRINT #1 ,"ENTER17;CR"
LINE INPUT #1,wavelen1$
w avelen1=VAL(w avelen1$)
C=C+.1
C$=STR$(C)
PRINT #1,"OUTPUT 17;C="C$""
PRINT #1,"OUTPUT 17;L"
PRINT #1 ,"ENTER17;CR"
LINE INPUT #1,wavelen2$
w avelen2=VAL(w avelen2$)
IF w avelen1>w avelen AND w avelen1>w avelen2 THEN printw ave=1
IF printw ave=0 THEN GOTO 3010
   C=C-1
   C$=STR$(C)
   pixelvalue=w avelen1
   pixelnumber=VAL(C$)
   LPRINT pixelvalue,pixelnumber
   GOTO 3040
```

```
     printwave=0

3010 C=C+1
     C$=STR$(C)
     wavelen$=""
     PRINT #1,"output 17;C="C$""
     PRINT #1,"output 17;L"
     PRINT #1,"enter17;CR"
     LINE INPUT #1,wavelen$
     wavelen=VAL(wavelen$)
     IF wavelen2>wavelen1 AND wavelen2>wavelen THEN printwave=1
     IF printwave=0 THEN GOTO 3020
        C=C-1
        C$=STR$(C)
     pixelvalue=wavelen2
     pixelnumber=VAL(C$)
     LPRINT pixelvalue,pixelnumber
     GOTO 3040
     printwave=0

3020 C=C+1
     C$=STR$(C)
     wavelen1$=""
     PRINT #1,"output 17;C="C$""
     PRINT #1,"output 17;L"
     PRINT #1,"enter17;CR"
     LINE INPUT #1,wavelen1$
     wavelen1=VAL(wavelen1$)
     IF wavelen>wavelen2 AND wavelen>wavelen1 THEN printwave=1
     IF printwave=0 THEN GOTO 3030
        C=C-1
        C$=STR$(C)
     pixelvalue=wavelen
     pixelnumber=VAL(C$)
     LPRINT pixelvalue,pixelnumber
     GOTO 3040
     printwave=0

3030 C=C+1
     C$=STR$(C)
     wavelen2$=""
     PRINT #1,"output 17;C="C$""
     PRINT #1,"output 17;L"
     PRINT #1,"enter17;CR"
     LINE INPUT #1,wavelen2$
     wavelen2=VAL(wavelen2$)
     IF wavelen1>wavelen AND wavelen1>wavelen2 THEN printwave=1
     IF printwave=0 THEN GOTO 3010
        C=C-1
        C$=STR$(C)
     pixelvalue=wavelen1
     pixelnumber=VAL(C$)
     LPRINT pixelvalue,pixelnumber
     GOTO 3040

3040
     IF LOOPFORCONTROL=1 THEN sixpeaknumber=pixelnumber
     IF LOOPFORCONTROL=1 AND pixelvalue<150000!THEN changeexposurecontrol=0
```

```
    IF LOOPFORCONTROL=1 AND pixelvalue>150000!THEN changeexposurecontrol=1:wavelen$="":wa
velen1$="":wavelen2$=""
    IF changeexposurecontrol=1 AND testtime=0 THEN exposure=.015:exposure$=STR$(exposure):P
RINT#1,"OUTPUT 17;ET "exposure$"":testtime=1:printwave=0:GOTO 3007
    IF changeexposurecontrol=1 AND testtime=1 THEN exposureover=1:printwave=0:GOTO 3007
    IF LOOPFORCONTROL=2 THEN hbetapeaknumber=pixelnumber
    IF LOOPFORCONTROL=3 THEN hepeaknumber=pixelnumber
    IF LOOPFORCONTROL=3 THEN GOTO 3045
    LOOPFORCONTROL=LOOPFORCONTROL+1
    printwave=0
    GOTO 3008
3045
flowcontrolnow=1
pruncontrol=0
halphameasuredbefore=0
percentchange=0
halphameasured=0
voltmeasuredbefore=0
voltcount=0
ovoltcount=0
hevoltcount=0
ovoltmeasuredbefore=0
hevoltmeasuredbefore=0
tebefore=0
te=0
tepercentchange=0
flowcount=0
flowcount1=0
goheflow=0
TIMER ON
    MENU 4,1,2,"Flow Control On"
    MENU 4,2,1,"Flow Control Off"
PRINT #1,"OUTPUT 17:DATA"
PRINT #1,"OUTPUT 17:LIVE-B"
CONTROLPRINT=1
3046 GOSUB screen1
DIALOG ON
MENU ON
RETURN measureadjust:
DIALOG OFF
MENU OFF
TIMER OFF
IF flowtype=2 THEN GOTO 3110
PRINT #1,"OUTPUT 17;STOP"
    IF exposureover=0 THEN PRINT #1,"OUTPUT 17;ACC-B"
    IF exposureover=1 THEN PRINT #1,"OUTPUT 17;LIVE-B"
    IF exposureover=1 THEN PRINT #1,"OUTPUT 17;STOP"

sixpeakpixelnumber$=STR$(sixpeaknumber)
PRINT #1,"OUTPUT 17;C="sixpeakpixelnumber$""
PRINT #1,"OUTPUT 17;L"
PRINT #1,"ENTER 17;CR"
LINE INPUT #1,sixpeak$
hbetapeaknumber$=STR$(hbetapeaknumber)
PRINT #1,"OUTPUT 17;C="hbetapeaknumber$""
```

```
PRINT #1,"OUTPUT 17;L"
PRINT #1,"ENTER 17;CR"
LINE INPUT #1,hbetapeak$
hepeakpixelnumber$=STR$(hepeaknumber)
PRINT #1,"OUTPUT 17;C="hepeakpixelnumber$""
PRINT #1,"OUTPUT 17;L"
PRINT #1,"ENTER 17;CR"
LINE INPUT #1,he2peak$ sixpeak=VAL(sixpeak$)
he2peak=VAL(he2peak$)
hbetapeak=VAL(hbetapeak$)
halphahemeasured=(sixpeak/he2peak)

percentchange=((halphahe*100)-(halphahemeasured*100))*1000
IF teset=0 THEN GOTO 3088
omatea=0
KTE=.001
Ia=sixpeak
Ib=hbetapeak
WHILE omatea=0
  omatec=(2.24)+(-1.93)+(LOG(Ia/Ib))-((.66)*(1/KTE))+((KTE)*(-8.57^-3))+((KTE^2)*(1.37^-3))+((KTE
^3)*(-2.24^-4))+((KTE^4)*(3.615^-5))
  KTE=KTE+.1
  IF INT(omatec)=1 THEN omatea=1
  WEND
omateb=0
KTE=KTE-.5
WHILE omateb=0
  omated=(2.24)+(-1.93)+(LOG(Ia/Ib))-((.66)*(1/KTE))+((KTE)*(-8.57^-3))+((KTE^2)*(1.37^-3))+((KTE
^3)*(-2.24^-4))+((KTE^4)*(3.615^-5))
  KTE=KTE+.01
  IF INT(omated)=1 THEN omateb=1
  WEND
  LPRINT ""
ktee=KTE*1000
kteee=INT(ktee)
KTE=kteee/1000
LOCATE 5,16
PRINT KTE;"eV"
3088 LOCATE 12,16
PRINT halphahemeasured
VOLTNOW=VAL(VOLTNOW$)
ovoltnow=VAL(ovoltnow$)
IF halphameasuredbefore=0 THEN GOTO 3089
voltchange=(VOLTNOW-voltmeasuredbefore)*1000
halphachange=(halphahemeasured-halphameasuredbefore)*1000
IF (voltchange>0 AND halphachange<0) OR (voltchange<0 AND halphachange>0) THEN voltcount=volt
count+1
IF (voltchange>0 AND halphachange>0) OR (voltchange<0 AND halphachange<0) THEN voltcount=volt
count-1
IF voltcount>3 THEN VOLTNOW=-(VOLTNOW)
3089

IF halphahemeasured >minusonetenthpercent AND halphahemeasured <plusonetenthpercent AND perc
entchange>0 THEN VOLTNOW=VOLTNOW+.0005:GOTO 3090
IF halphahemeasured >minusonequarterpercent AND halphahemeasured <plusonequarterpercent AND
``` percentchange>0 THEN VOLTNOW =VOLTNOW +.001 :GOTO 3090

IF halphahemeasured >m inusonehalfpercent AND halphahemeasured <plusonehalfpercent AND percentchange>0 THEN VOLTNOW =VOLTNOW +.0025 :GOTO 3090

IF halphahemeasured >m inusonepercent AND halphahemeasured <plusonepercent AND percentchange>0 THEN VOLTNOW =VOLTNOW +.005 :GOTO 3090

IF halphahemeasured >m inusfivepercent AND halphahemeasured <plusfivepercent AND percentchange>0 THEN VOLTNOW =VOLTNOW +.025 :goheflow =1 :GOTO 3090

IF halphahemeasured >m inustenpercent AND halphahemeasured <plustenpercent AND percentchange>0 THEN VOLTNOW =VOLTNOW +.075 :goheflow =1 :GOTO 3090

IF halphahemeasured >m inusonetenthpercent AND halphahemeasured <plusonetenthpercent AND percentchange<0 THEN VOLTNOW =VOLTNOW -.0005 :GOTO 3090

IF halphahemeasured >m inusonequarterpercent AND halphahemeasured <plusonequarterpercent AND percentchange<0 THEN VOLTNOW =VOLTNOW -1 :GOTO 3090

IF halphahemeasured >m inusonehalfpercent AND halphahemeasured <plusonehalfpercent AND percentchange<0 THEN VOLTNOW =VOLTNOW -.0025 :GOTO 3090

IF halphahemeasured >m inusonepercent AND halphahemeasured <plusonepercent AND percentchange<0 THEN VOLTNOW =VOLTNOW -.005 :GOTO 3090

IF halphahemeasured >m inusfivepercent AND halphahemeasured <plusfivepercent AND percentchange<0 THEN VOLTNOW =VOLTNOW -.025 :goheflow =1 :GOTO 3090

IF halphahemeasured >m inustenpercent AND halphahemeasured <plustenpercent AND percentchange<0 THEN VOLTNOW =VOLTNOW -.075 :goheflow =1 :GOTO 3090

IF halphahemeasured > halphahe THEN VOLTNOW =VOLTNOW -.1 :goheflow =1 :GOTO 3090
IF halphahemeasured < halphahe THEN VOLTNOW =VOLTNOW +.1 :goheflow =1 :GOTO 3090
3090 VOLTNOW =ABS(VOLTNOW )
IF VOLTNOW <=0 THEN VOLTNOW =1.79
VOLTNOW $=STR$(VOLTNOW )
IF controlsiflow =1 THEN PRINT #1,"OUTPUT 13;V"VOLTNOW $"FIX"
IF percentchange<0 AND goheflow =1 AND flow count>5 THEN hevoltnow =hevoltnow +.05 :GOTO 3091
IF percentchange>0 AND goheflow =1 AND flow count>5 THEN hevoltnow =hevoltnow -.05
3091 IF teset=0 THEN GOTO 3092 tepercentchange=((KTE-teset)*100)
IF KTE >tem inusonetenthpercent AND KTE <teplusonetenthpercent AND tepercentchange>0 THEN ovoltnow =ovoltnow +.00005 :GOTO 3092

IF KTE >tem inusonequarterpercent AND KTE <teplusonequarterpercent AND tepercentchange>0 THEN ovoltnow =ovoltnow +.00015 :GOTO 3092

IF KTE >tem inusonehalfpercent AND KTE <teplusonehalfpercent AND tepercentchange>0 THEN ovoltnow =ovoltnow +.00025 :GOTO 3092

IF KTE >tem inusonepercent AND KTE <teplusonepercent AND tepercentchange>0 THEN ovoltnow =ovoltnow +.0005 :GOTO 3092

IF KTE >tem inusfivepercent AND KTE <teplusfivepercent AND tepercentchange>0 THEN ovoltnow =ovoltnow +.0025 :GOTO 3092

IF KTE >tem inustenpercent AND KTE <teplustenpercent AND tepercentchange>0 THEN ovoltnow =ovoltnow +.0075 :GOTO 3092

IF KTE >tem inusonetenthpercent AND KTE <teplusonetenthpercent AND tepercentchange<0 THEN ovoltnow =ovoltnow -.00005 :GOTO 3092

IF KTE >tem inusonequarterpercent AND KTE <teplusonequarterpercent AND tepercentchange<0 THEN ovoltnow =ovoltnow -.00015 :GOTO 3092

IF KTE >tem inusonehalfpercent AND KTE <teplusonehalfpercent AND tepercentchange<0 THEN ovoltnow =ovoltnow -.00025 :GOTO 3092

IF KTE >tem inusonepercent AND KTE <teplusonepercent AND tepercentchange<0 THEN ovoltnow =ovoltnow -.0005 :GOTO 3092

IF KTE >tem inusfivepercent AND KTE <teplusfivepercent AND tepercentchange<0 THEN ovoltnow =ovoltnow -.0025 :GOTO 3092

IF KTE >tem inustenpercent AND KTE <teplustenpercent AND tepercentchange<0 THEN ovoltnow =ovoltnow -.0075 :GOTO 3092

```
IF KTE > teset THEN ovoltnow =ovoltnow -.01 :GOTO 3092
IF KTE < teset THEN ovoltnow =ovoltnow +.01
3092
IF flow count1>5 AND teset=0 AND percentchange>0 AND goheflow =1 THEN ovoltnow =ovoltnow +.00
5
IF flow count1>5 AND teset=0 AND percentchange<0 AND goheflow =1 THEN ovoltnow =ovoltnow -.00
5
ovoltnow $=STR$(ovoltnow )
IF controloxygenflow =1 THEN PRINT #1,"OUTPUT 10;V"ovoltnow $"FIX"
3095
hevoltnow $=STR$(hevoltnow )
PRINT #1,"TERM ;CR LF"
IF controlheflow =1 THEN PRINT #1,"OUTPUT 705;VSET"hevoltnow $""
PRINT #1,"TERM ;CR"
pruncontrol=pruncontrol+1
heflow =(hevoltnow *19.81)+.6455
IF heflow <10 OR heflow >100 THEN hevoltnow =2.5
hflow =(VOLTNOW *17.69)-1.514
IF hflow <5 OR hflow >60 THEN GOSUB errorinflow :GOSUB turnoffflow control:RETURN
oflow =(ovoltnow *216.7)-12.68
IF ovoltnow >.4 THEN ovoltnow =.13
flow count=flow count+1
flow count1 =flow count1 +1
halpham easuredbefore=halphahem easured
voltn easuredbefore=VOLTNOW
ovoltm easuredbefore=ovoltnow
hevoltn easuredbefore=hevoltnow
goheflow =0
now $=TIME$
LPRINT now $
LPRINT "Auto Halpha/He Control"
LPRINT "Volts out:";VOLTNOW
LPRINT "Halpha/He:";halphahem easured
LPRINT "Ha/He setpoint";halphahe
LPRINT "Percentchange";percentchange
LPRINT "Te";KTE
LPRINT "Te setpoint";teset
LPRINT "Tepercentchange";tepercentchange
LPRINT "ovoltnow ";ovoltnow
LPRINT "He flow (sccm )";heflow
LPRINT "hevoltnow ";hevoltnow
LPRINT "flow count";flow count
LPRINT "1 flow count";flow count1
DIALOG ON
MENU ON
TIMER ON
RETURN 3110
PRINT #1,"output 18;A0X"
PRINT #1,"output 18;N071X"
PRINT #1,"output 18;N033X"
PRINT #1,"output 18;B061X"
PRINT #1,"output 18;C061X"
PRINT #1,"TRIGGER 16"
PRINT #1,"ENTER 16"
LINE INPUT #1,hflow $
hflow =VAL(hflow $)
```

```
PRINT #1,"TRIGGER 16"
PRINT #1,"ENTER 16"
LINE INPUT #1,HFLOW 1$
PRINT #1,"OUTPUT 18;NO61X"
PRINT #1,"output 18;CO33X"
HFLOW 1=VAL(HFLOW 1$)
hflow =(hflow +hflow )/2
hflow =(88.85*hflow )-99.31
CHANGE=0
IF hflow >fm inusonetenthpercent AND hflow <fplusonetenthpercent THEN VOLTNOW =VOLTNOW +.000
5:CHANGE=1:GOTO 3111
IF hflow >fm inusonequarterpercent AND hflow <fplusonequarterpercent THEN VOLTNOW =VOLTNOW +
.001:CHANGE=1:GOTO 3111
IF hflow >fm inusonehalfpercent AND hflow <fplusonehalfpercent THEN VOLTNOW =VOLTNOW +.0025:C
HANGE=1:GOTO 3111
IF hflow >fm inusonepercent AND hflow <fplusonepercent THEN VOLTNOW =VOLTNOW +.005:CHANGE=1
:GOTO 3111
IF hflow >fm inusfivepercent AND hflow <fplusfivepercent THEN VOLTNOW =VOLTNOW +.025:CHANGE=
1:GOTO 3111
IF hflow >Fm inustenpercent AND hflow <Fplustenpercent THEN VOLTNOW =VOLTNOW +.075:CHANGE=1
:GOTO 3111

3111 VOLTNOW $=STR$(VOLTNOW )
IF CHANGE=1 THEN PRINT #1,"OUTPUT 13;V"VOLTNOW $"FIX"

'Now pump vaporizer ::NO NEED TO PUMP VAPORIZER SINCE IT
'HAS IT'S OWN CLOSED LOOP CONTROL FEEDBACK VIA PRESSURE
'INSIDE THE VAPORIZER
DIALOG ON
MENU ON
TIMER ON
RETURN errorinflow :
DIALOG OFF
```

IT IS CLAIMED:

1. In a process of depositing a thin film of material on a substrate in a chamber wherein a plasma is formed with a plurality of controllable process parameters, said plasma containing a plurality of atomic and/or molecular species which each have an observable emission of electromagnetic radiation within a visible or near visible wavelength range whose nature changes upon changing said controllable process parameters, a method of controlling the process, comprising the steps of:
- detecting two characteristics of the radiation emission of a single species in the plasma,
- electronically comparing said two characteristics, and
- causing one or more of said process parameters to automatically be changed in order to adjust the two detected single species radiation emission characteristics to have a predetermined desired relationship.

2. The method according to claim 1 wherein the detecting step includes detecting the intensities of the single species' emission in two different bandwidth regions as said two characteristics.

3. The method according to claim 2 wherein the comparing step includes electronically ratioing the intensities of the two bandwidth emissions, and wherein the automatic adjustment step includes comparing that ratio with a desired quantity.

4. A method according to claim 2 which comprises an additional step of detecting an intensity of a defined bandwidth of emission of another species in the plasma.

5. A method according to claim 1 wherein the radiation emission detecting step includes detecting said emission at a physical location with respect to the plasma wherein a ratio of intensities within two specific narrow bandwidths of said emission is substantially maximized.

6. In a process of depositing a thin film of material on a substrate in a chamber wherein a plasma is formed with a plurality of controllable process parameters that include pressure, individual rates of flow of two or more gases into the chamber, and an electric field, a method of controlling the process, comprising the steps of:
- detecting an intensity of each of two narrow bandwidth lines of visible or near visible electromagnetic radiation emission from a single species of the plasma,
- electronically calculating a ratio of said wavelength band intensities,
- electronically comparing said ratio with a desired ratio to be maintained during the deposition process, and causing one or more of said process parameters to automatically be changed in order to adjust the calculated ratio to reduce any difference between it and said desired ratio.

7. A method according to claim 6 which additionally comprises the steps of:
    detecting an intensity of a narrow bandwidth line of visible or near visible electromagnetic radiation emission from another species that results from an energy level that is significantly higher than that of the detected lines of said single species,
    electronically calculating a second ratio of emission line intensities, said second ratio being between the intensity of one of the two lines of emission from said single species and the intensity of the emission line of said another species,
    electronically comparing the second calculated ratio and a second desired ratio to be maintained during the deposition process, and
    causing one or more of said process parameters to automatically be changed in order to adjust the second calculated ratio to reduce any difference between it and the second desired ratio.

8. A method according to claim 7 wherein said another species consists of an inert gas.

9. A method according to claim 6 wherein the adjusting step includes the step of automatically changing the rate of flow of at least one of said gases into the chamber.

10. A method according to claim 7 wherein the second ratio adjusting step includes the step of automatically changing the rate of flow of at least one of said gases into the chamber.

11. A method according to claim 6 wherein the comparing step includes the step of calculating from the intensity ratio the average electron temperature of the plasma.

12. A process of depositing a thin film of material on a substrate in a chamber wherein a plasma is formed in a region of magnetic and electric fields as the result of flowing at least first and second gases into said chamber, comprising the steps of:
    detecting first and second intensity levels of each of two narrow bandwidth lines of visible or near visible electromagnetic radiation emission from a single species of the plasma,
    detecting a third intensity level of a narrow bandwidth line of visible or near visible electromagnetic radiation emission from another species that results from an energy level that is significantly higher than that of the detected lines of said single species,
    electronically obtaining a first ratio of said first and second intensity levels,
    electronically obtaining a second ratio of said first and third intensity levels,
    adjusting the rate of flow of the first gas into said chamber in a manner to cause said first ratio to be maintained at a first predetermined level, and
    adjusting the rate of flow of the second gas into said chamber in a manner to cause said second ratio to be maintained at a second predetermined level.

13. The process according to claim 12 wherein said second gas is characterized by having molecular in which said single species is contained in a manner that it is fractionalized therefrom in the plasma, said another species is characterized by being inert, and said first gas is characterized by altering an average energy of electrons in the plasma.

14. The process according to claim 13 wherein said first gas includes oxygen, and said second gas includes an organosilicon vapor.

15. The method according to claim 14 wherein said first and second intensity levels are the hydrogen alpha and hydrogen beta emissions and said third intensity level is a helium emission.

16. The method according to claim 15 wherein said second gas includes hexamethyldisiloxane.

17. The process according to claim 12 wherein said second gas includes an organosilicon vapor.

18. The process according to claim 12 wherein said first gas includes oxygen.

19. A method according to claim 12 wherein the intensity level detecting steps detect the plasma emission intensity from a region of the plasma wherein said second intensity ratio is substantially maximized.

20. A method of determining the level of electron temperature in a plasma, comprising the steps of:
    detecting an intensity of each of two narrow bandwidth lines of visible or near visible electromagnetic radiation emission from a single species of the plasma,
    electronically calculating a ratio of said wavelength band intensities, and
    electronically calculating an estimate of the average electron temperature of the plasma from said ratio.

* * * * *